US007002341B2

(12) United States Patent
Baudenbacher et al.

(10) Patent No.: US 7,002,341 B2
(45) Date of Patent: Feb. 21, 2006

(54) SUPERCONDUCTING QUANTUM INTERFERENCE APPARATUS AND METHOD FOR HIGH RESOLUTION IMAGING OF SAMPLES

(75) Inventors: Franz J. Baudenbacher, Nashville, TN (US); Nicholas T. Peters, Chicago, IL (US); John P. Wikswo, Jr., Brentwood, TN (US); Robert L. Fagaly, Carlsbad, CA (US)

(73) Assignee: Vanderbilt University, Nashville, TN (US)

( * ) Notice: Subject to any disclaimer, the term of this patent is extended or adjusted under 35 U.S.C. 154(b) by 0 days.

(21) Appl. No.: 10/650,263

(22) Filed: Aug. 27, 2003

(65) Prior Publication Data

US 2004/0145366 A1   Jul. 29, 2004

Related U.S. Application Data

(60) Provisional application No. 60/407,417, filed on Aug. 28, 2002, now abandoned.

(51) Int. Cl.
*G01R 33/02* (2006.01)
(52) U.S. Cl. ...................................... 324/248; 600/409
(58) Field of Classification Search ................ 324/248, 324/226, 235, 240, 750, 249, 244, 228, 239; 600/409; 505/162, 846, 160, 842; 326/5; 327/366, 367, 370, 527, 528
See application file for complete search history.

(56) References Cited

U.S. PATENT DOCUMENTS

| | | | |
|---|---|---|---|
| 4,613,816 A * | 9/1986 | Zeamer ....................... 324/248 |
| 5,038,104 A * | 8/1991 | Wikswo et al. ............. 324/258 |
| 5,065,582 A | 11/1991 | Seifert |
| 5,113,136 A | 5/1992 | Hayashi et al. |
| 5,122,744 A | 6/1992 | Koch |
| 5,243,281 A | 9/1993 | Ahonen et al. |
| 5,293,119 A | 3/1994 | Podney |
| 5,311,129 A | 5/1994 | Ludwig et al. |
| 5,326,986 A * | 7/1994 | Miller et al. ................. 505/162 |
| 5,444,372 A | 8/1995 | Wikswo, Jr. et al. |
| 5,491,411 A * | 2/1996 | Wellstood et al. .......... 324/248 |
| 5,668,315 A * | 9/1997 | Van Kann et al. ........ 73/382 G |
| 5,786,690 A | 7/1998 | Kirtley et al. |
| 5,825,183 A * | 10/1998 | Morooka et al. ........... 324/248 |
| 5,884,485 A * | 3/1999 | Yamaguchi et al. .......... 62/3.2 |
| 5,894,220 A * | 4/1999 | Wellstood et al. .......... 324/248 |
| 6,154,026 A | 11/2000 | Dantsker et al. |
| 6,424,853 B1 * | 7/2002 | Tsukada et al. ............. 600/409 |
| 6,516,281 B1 | 2/2003 | Wellstood et al. |
| 6,563,312 B1 * | 5/2003 | Saho et al. .................. 324/248 |
| 2004/0007004 A1 * | 1/2004 | Sapir ......................... 62/228.1 |

OTHER PUBLICATIONS

Supplementary Images for Science Report: A Low Temperature Transfer of ALH84001 from Mars to Earth, no author given, published online Feb. 24, 2001 by Caltech, note entire article, enhance drawings and print-out of publication date.*

(Continued)

*Primary Examiner*—Bot Ledynh
*Assistant Examiner*—Kenneth J. Whittington
(74) *Attorney, Agent, or Firm*—Duckor Spradling Metzger & Wynne; Bernard L. Kleinke

(57) ABSTRACT

A method and apparatus performs high resolution imaging. The disclosed apparatus includes a low temperature SQUID sensor mounted in close proximity to a dewar thin window. A radiation shield has an extension surrounding the detection coil.

33 Claims, 12 Drawing Sheets

OTHER PUBLICATIONS

Clem, John R., "Johnson Noise From Normal Metal Near a Superconducting SQUID Gradiometer Circuit," IEEE Trans. Magn., Mar. 1987, pp. 1093-1096, vol. Mag-23, No. 2.

Ketchen, M.B., et al., "Design, Fabrication, and Performance of Integrated Miniature SQUID Susceptometers," IEEE Trans. Mag., Mar. 1989, pp. 1212-1215, vol. 25, No. 2.

Buchanan, D.S., et al., Williamson, S. J. (Ed.) "MicroSQUID: A Close-Spaced Four Channel Magnetometer," Advances in Biomagnetism, 1990, pp. 677-679, Plenum Press, New York.

Weinstock, Harold, "A Review of SQUID Magnetometry Applied to Nondestructive Evaluation," IEEE Trans. Magn., Mar. 1991, pp. 3231-3236, vol. 27, No. 2.

Clarke, J., Weinstock, H. (Ed.), "SQUID Sensors: Fundamentals, Fabrication and Applications," 1996, pp. 1-23 and 26-62, vol. 329, Kluwer, The Netherlands.

Dantsker, E., et al., "Low Excess Flux Noise in (YBCO) SQUIDs Cooled in Static Magnetic Fields," Jun. 1997, pp. 2772-2775, IEEE Trans. Appl. Supercond. vol. 7, No. 2.

Lee, Thomas S., et al., "High Tc SQUID Microscope for Room Temperature Samples," Jun. 1997, pp. 3147-3150, IEEE Trans. Appl. Supercond. vol. 7, No. 2.

Wellstood, F.C., et al., "Magnetic Microscopy Using SQUIDs," Jun. 1997, pp. 3134-3138, IEEE Trans. Appl. Supercond. vol. 7, No. 2.

Touloukian, Y.S., Buyco, E.H., "Thermophysical Properties of Matter," 1970, vol. 5 IFI/Plenum, N.Y.

Tesche, C.D., Clarke, J., "dc SQUID: Noise and Optimization," J. Low Temp. Phys., 1977, pp. 301-329, vol. 29, Nos. 3/4.

Roth, B.J., Wikswo, J.P. Jr., "A Bidomain Model for the Extracellular Potential and Magnetic Field of . . . ," IEEE Trans. Biomed. Engng., 1986, pp. 467-469, vol. BME33 (4).

Wikswo, J.P. Jr., Fast, R.W. (Ed.), "High-Resolution Measurements of Biomagnetic Fields," Adv. Cryo. Engng., 1988, pp. 107-116, vol. 33.

Roth, B.J., et al., "Using a Magnetometer to Image a Two-Dimensional Current Distribution," J. Appl. Phys., 1989, pp. 361-372, vol. 65, No. 1.

Sepulveda, N.G., et al., "Current Injection Into a Two-Dimensional Anisotropic Bidomain," Biophys. J., 1989, pp. 987-999, vol. 55.

Tan, S., et al., "The Magnetic Field of Cortical Current Sources: the Application of a Spatial Filtering Model to the Forward . . . ," Bull. Am. Phys. Soc., 1989, pp. 1301, vol. 34.

Roth, B.J., Wikswo, J.P. Jr., "Apodized Pickup Coils for Improved Spatial Resolution of SQUID Magnetometers," Rev. Sci. Instrum., 1990, pp. 2439-2448, vol. 61.

Thomas, I.M., et al., "High-Resolution Magnetic Susceptibility Imaging: A New Technique for Studying Pyroclastic Rock . . . ," Trans., Am. Geophys. Union, 1991, pp. 138, vol. 72.

Black, R.C., et al., "Magnetic Microscopy Using a Liquid Nitrogen Cooled (YBCO) Superconducting Quantum Interference Device," Appl. Phys. Lett., 1993, pp. 2128-2130, vol. 62.

Henriquez, C.S., Ph.D., "Simulating the Electrical Behavior of Cardiac Tissue Using the Bidomain Model," Crit. Rev. Biomed. Engng., 1993, pp. 1-77, vol. 21(1).

Thomas, I.M., et al., "A Distributed Quasi-Static Ionic Current Source in the 3-4 Day Old Chicken Embryo," Phys. Med. Biol., 1993, pp. 1311-1328, vol. 38.

Varpula, T., Seppa, H., "Inductive Noise Thermometer: Practical Realization," Rev. Sci. Instrum., 1993, pp. 1593-1600, vol. 64 (6).

Roth, B.J., Wikswo, J.P. Jr., "Electrical Stimulation of Cardiac Tissue: A Bidomain Model with Active Membrane Properties," IEEE Trans. Biomed. Engng., 1994, pp. 232-240, vol. 41.

Barach, J.P., Wikswo, J.P. Jr., "Magnetic Fields from Simulated Cardiac Action Currents," 1994, IEEE Trans. Biomed. Engng. pp. 969-974, vol. 41.

Kirtley, J.R., et al., "High-Resolution Scanning SQUID Microscope," 1995, Appl. Phys. Lett. pp. 1138-1140, vol. 66.

Staton, D.J., Wikswo, J.P. Jr.,"Magnetic Inverse Method for Determination of Anisotropic Electrical Conductivities . . . ," 1995, pp. 671-675, IOS Press, Amsterdam, the Netherlands.

Chemla, Y. R., et al., "A New Study of Bacterial Motion: Superconducting Quantum Interference Device Microscopy of Magnetotactic . . . ," Biophys. J., 1999, pp. 3323-3330, vol. 76.

Cochran, A., et al., "Advances in the Theory and Practice of SQUID NDE," 1996, Rev. Prog. Quant. Nondestr. Eval., pp. 1151-1158, vol. 15.

Kirtley, J.R., et al., "Direct Imaging of Integer and Half-Integer Josephson Vortices in High-Tc Grain Boundaries," 1996, Phys. Rev. Letr. pp. 1336-1339, vol. 76 (8).

Lee, T.S., et al., "High-Transition Temperature Superconducting Quantum Interference Device Microscope," 1996, Rev. Sci. Instrum., pp. 4208-4215, vol. 67 (12).

Wikswo, J.P. Jr., "High-Resolution Magnetic Imaging: Cellular Action Currents and Other Applications," 1996, pp. 307-360, Kluwer, the Netherlands.

Abedi, A., et al., "A Superconducting Quantum Interference Device Magnetometer System for Quantitative Analysis and imaging of Hidden . . . ," 1999, pp. 4640-4651, vol. 70.

Chatraphorn, S., et al., "High-Tc Scanning SQUID Microscopy: Imaging Integrated Circuits Beyond the Standard Near-Field Limit," 1999, Bull. Am. Phys. Soc., pp. 1554, vol. 44.

Kirtley, J.R., and Wikswo, J.P. Jr., "Scanning SQUID Microscopy," 1999, Annu. Rev. Mater. Sci., pp. 117-148, vol. 29.

Lin, S.F., Wikswo, J.P., Jr. "Panoramic Optical Imaging of Electrical Propagation in Isolated Heart," 1999, J. Biomed. Opt., pp. 200-207, vol. 4(2).

Weiss, B.P., et al., "A Low Temperature Transfer of ALH84001 from Mars to Earth," 2000, Science, pp. 791-795, vol. 290.

Benjamin P. Weiss, et al., "Records of an Ancient Martian Magnetic Field in ALH84001," Earth and Planetary Science Letters 201 (2002) 449-463.

* cited by examiner

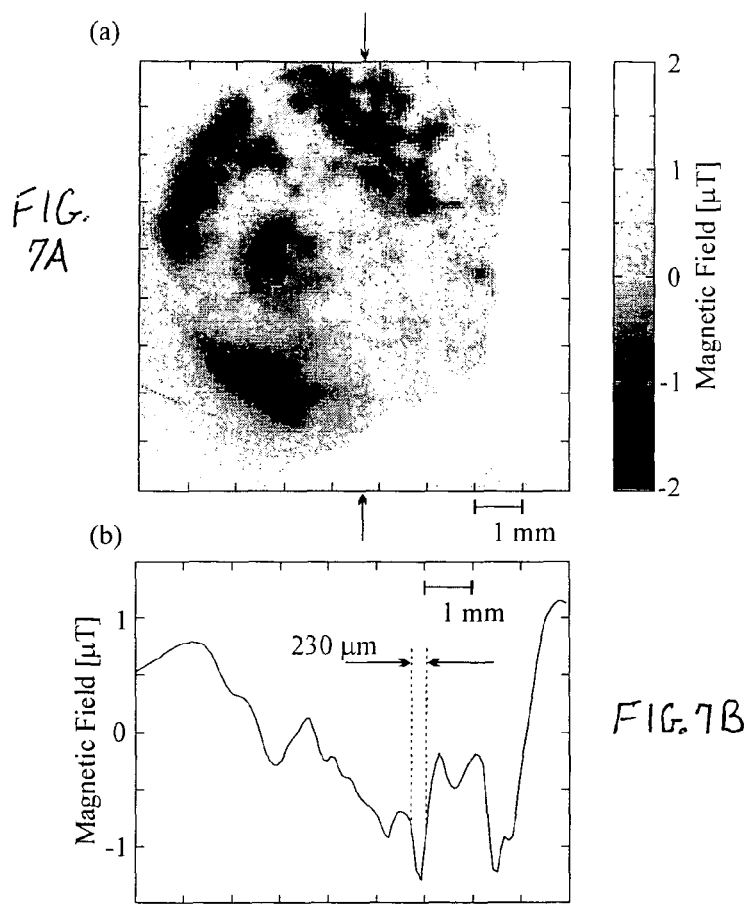
FIG. 7A
FIG. 7B
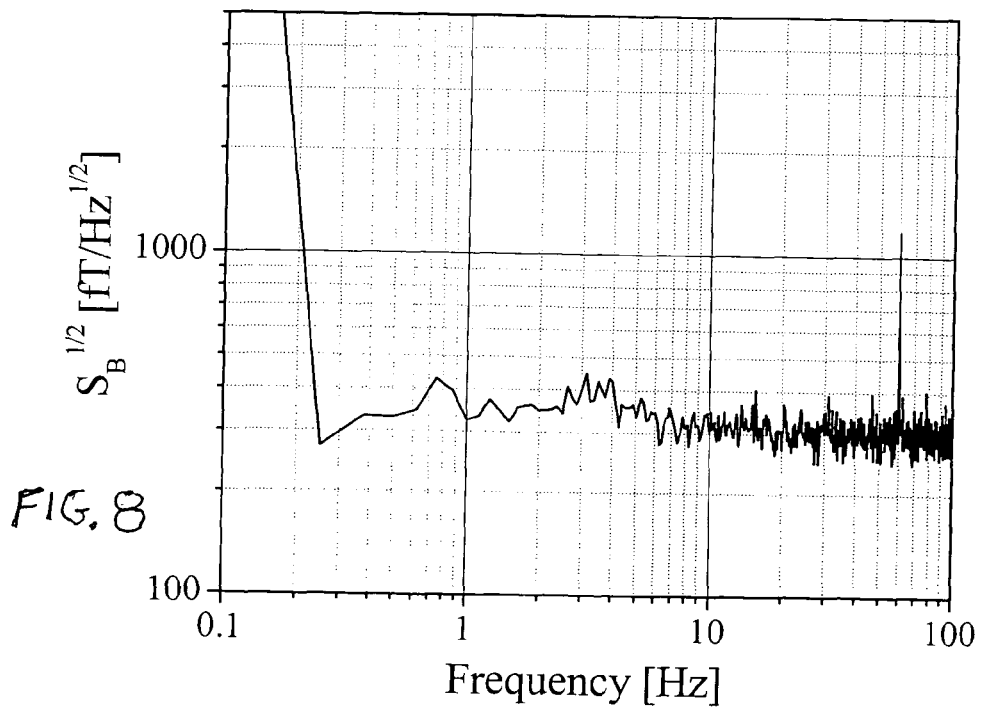
FIG. 8

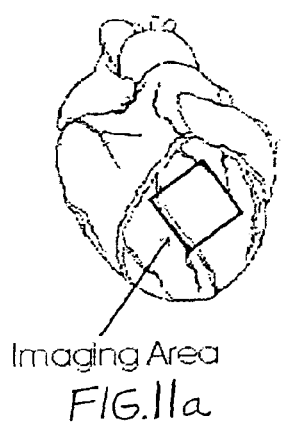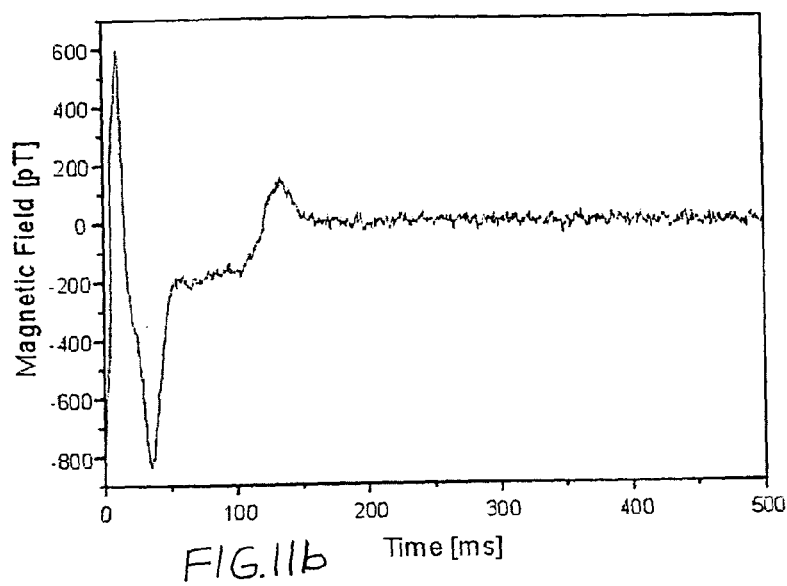
FIG.11a
FIG.11b
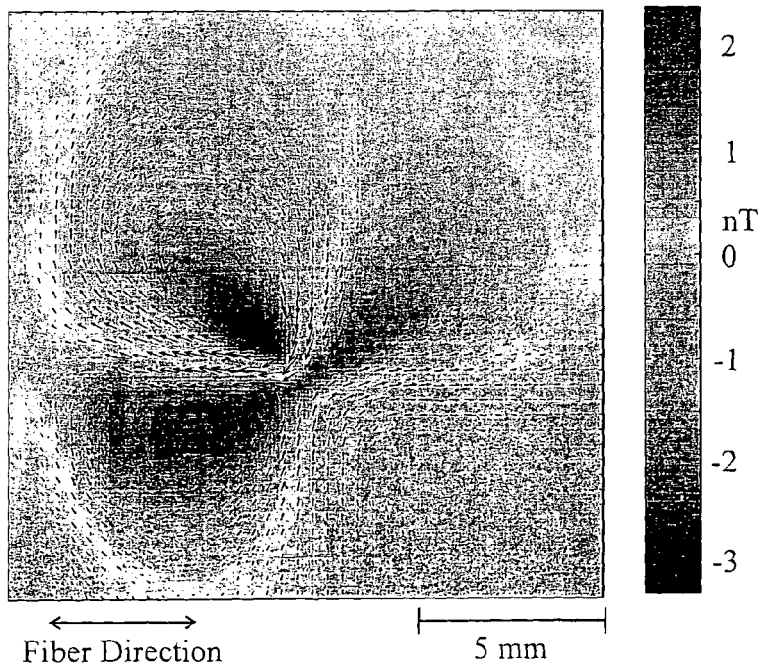
FIG.12

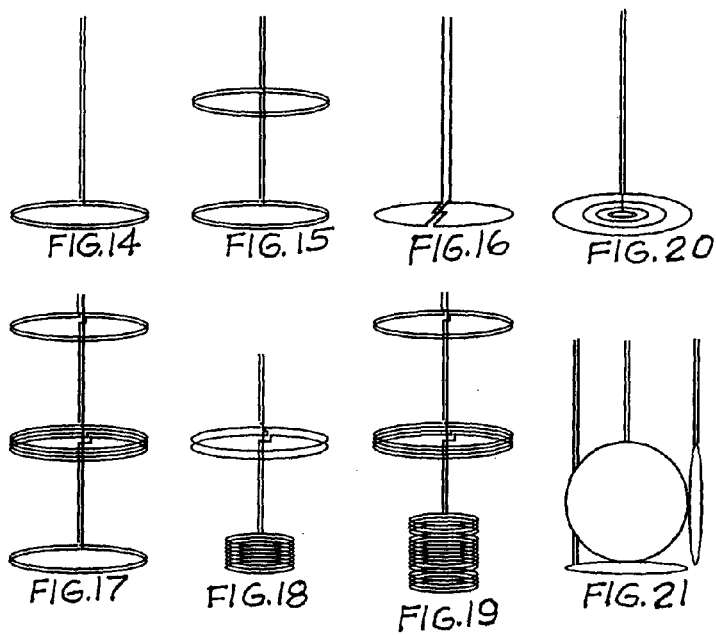
FIG.14  FIG.15  FIG.16  FIG.20
FIG.17  FIG.18  FIG.19  FIG.21
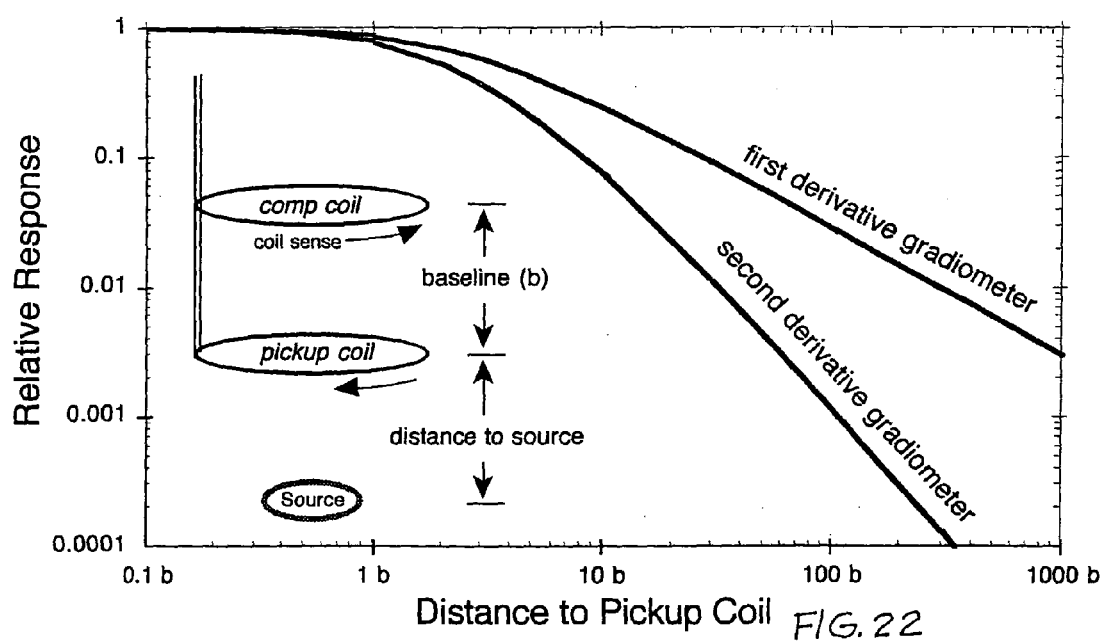
FIG.22

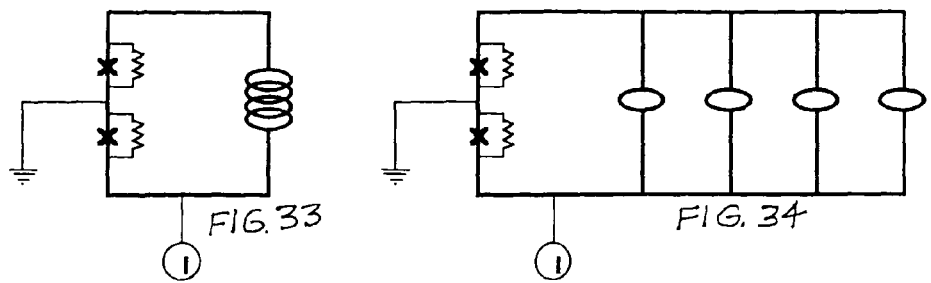
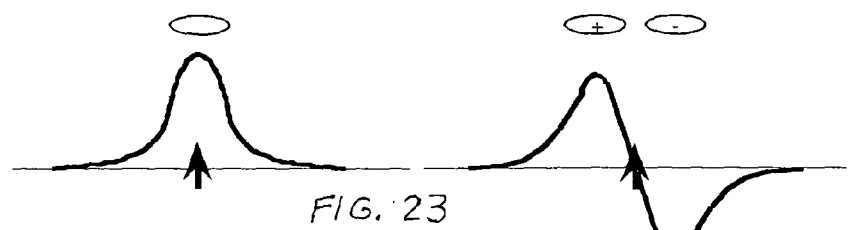
FIG. 23
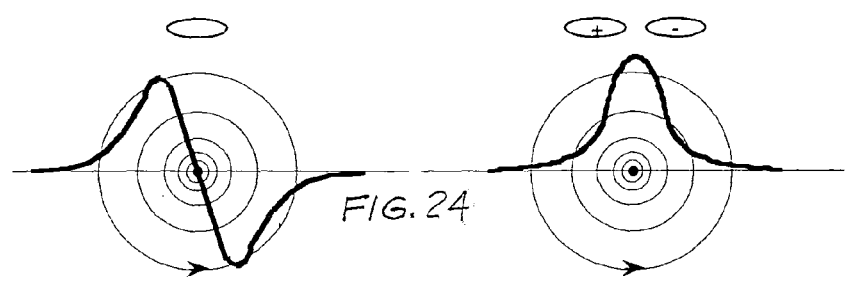
FIG. 24
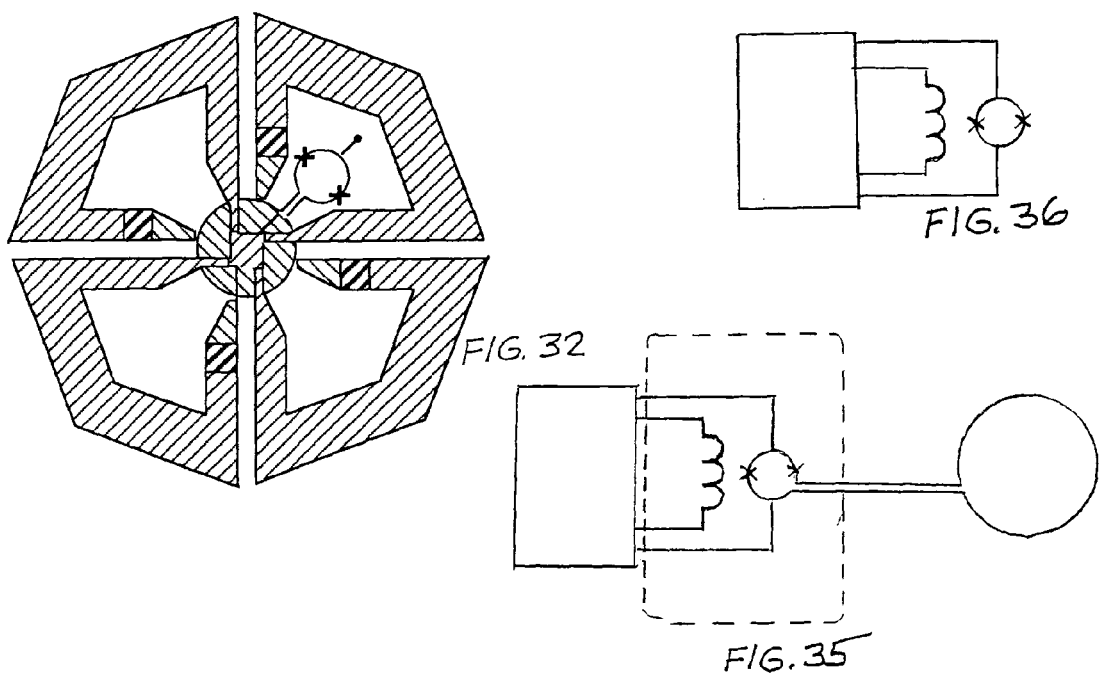

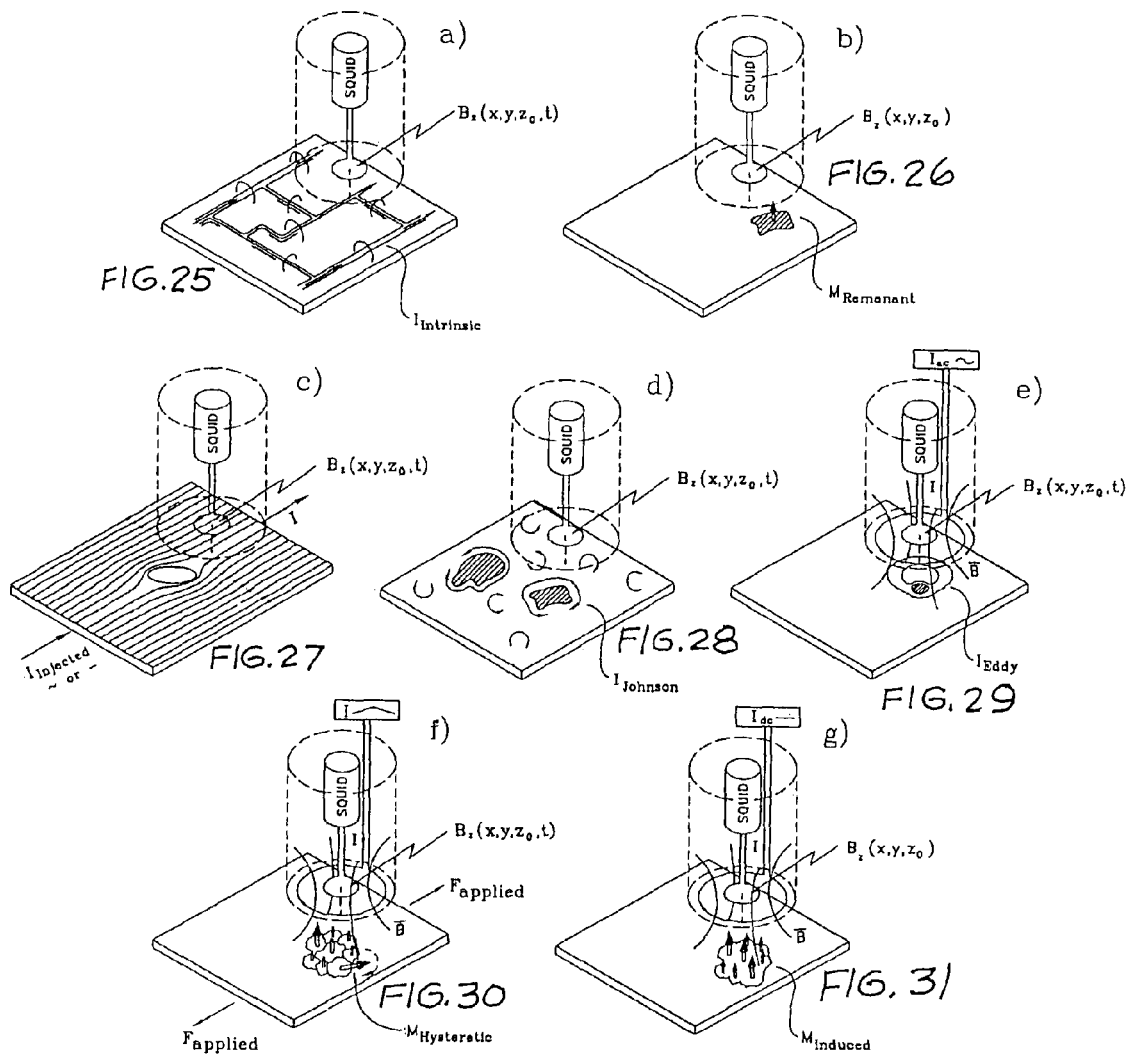

SUPERCONDUCTING QUANTUM INTERFERENCE APPARATUS AND METHOD FOR HIGH RESOLUTION IMAGING OF SAMPLES

RELATED APPLICATIONS

This application claims priority to U.S. provisional application Ser. No. 60/407,417 abandoned, filed Aug. 28, 2002, entitled METHOD AND APPARATUS FOR HIGH RESOLUTION IMAGING OF SAMPLES USING SUPERCONDUCTING QUANTUM INTERFERENCE DEVICES, which is incorporated herein by reference in its entirety.

BACKGROUND OF THE INVENTION

1. Field of the Invention

The present invention related to methods and apparatus for high resolution imaging of samples using a superconductive quantum interference device (SQUID).

2. Background Art

This section describes the background of the disclosed embodiments of the present invention. There is no intention, either expressed or implied, that the background art discussed in this section legally constitutes prior art.

There have been a variety of different types and kinds of devices for imaging samples. One example of apparatus and methods used for high resolution imaging employs superconducting quantum interference devices (SQUIDs). For example, reference may be made to the following articles, each of which is incorporated herein by reference:

J. P. Wikswo, Jr., High-Resolution Magnetic Imaging: Cellular Action Currents and Other Applications, edited by H. Weinstock (Kluwer Academic, The Netherlands, 1996), Vol. 329, pp. 307–360.

I. M. Thomas, S. M. Freake, S. J. Swithenby, and J. P. Wikswo, Jr., Phys. Med. Biol. 38, 1311 (1993).

I. M. Thomas, T. C. Moyer, and J. P. Wikswo, Jr., Trans., Am. Geophys. Union 72, 138 (1991).

S. Chatraphorn, E. F. Fleet, and F. C. Wellstood, Bull. Am. Phys. Soc. 44, 1554 (1999).

J. R. Kirtley, C. C. Tsuci, M. Rupp, J. Z. Sun, L. S. Yu-Jabnes, A. Gupta, M. B. Ketchen, K. A. Moler, and M. Bhushan, Phys. Rev. Letr. 76, 1336 (1996).

Y. R. Chemla, H. L. Grossman, T. S. Lee, J. Clarke, M. Adamkiewicz, and B. B. Buchanan, Biophys. J. 76, 1336 (1996).

H. Weinstock, IEEE Trans. Magn. 27, 3231 (1991).

A. Cochran, G. B. Donaldson, C. Carr, D. M. McKirdy, M. E. Walker, and U. Klein, Rev. Prog. Quant. Nondestr. Eval. 15, 1151 (1996).

A. Abedi, J. Fellenstein, A. J. Lucas, and J. P. Wikswo, Jr., Rev. Sci. Instrum. 70, 4640 (1999).

T. Varpula and H. Seppa, Rev. Sci. Instrum, 64, 1593 (1993).

D. S. Buchanan, D. B. Crum, D. Cox, and J. P. Wikswo, Jr., in Micro-SQUID: A Close-Space Four Channel Magnetometer, edited by S. J. Williamson, M. Hoke, G. Stroink, and M. Ktani (Plenum, N.Y., 1990), pp. 677–679.

J. R. Kirtley, M. B. Ketchen, K. G. Stawiasz, J. Z. Sun, W. J. Gallagher, S. H. Blanton, and S. J. Wind, Appl. Phys. Lett. 66, 1138 (1995).

R. C. Black, A. Mathai, F. C. Wellstood, E. Dantsker, A. H. Miklich, D. T. Nemeth, J. J. Kingston, and J. Clarke, Appl. Phys. Lett. 62, 2128 (1993).

T. S. Loc, E. Dantsker, and J. Clarke, Rev. Sci. Instrum. 67, 4208 (1996).

C. D. Tesche and J. Clarke, J. Low Temp. Phys. 29, 301 (1977).

E. Dantsker, S. Tanaka, P. A. Nilsson, R. Kleiner, and J. Clarke, IEEE Trans. Appl. Supercond. 7, 2772 (1997).

Y. S. Touloukian and E. H. Buyco, Thermophysical Properties of Matter (IFI/Plenum, N.Y., 1970), Vol. 5.

J. R. Clem, IEEE Trans. Magn. 23, 1093 (1987).

J. Clarke, in SQUID Fundamentals, edited by H. Weinstock (Kluwer Academic, The Netherlands, 1996), Vol. 329, pp.1–62.

J. R. Kirtley and J. P. Wikswo, Jr., Annu. Rev. Mater. Sci. 29, 117 (1999).

B. J. Roth and J. P. Wikswo, Jr., Bull. Am. Phys. Soc. 61, 2439 (1990).

S. Tan, B. J. Roth, and J. P. Wikswo, Jr., Bull. Am. Phys. Soc. 34, 1301 (1989).

F. C. Wellstood, Y. Gim, A. Amar, R. C. Black, and A. Mathai, IEEE Trans. Appl. Supercond. 7, 3134 (1997).

B. P. Weiss, J. L. Kirschvink, F. J. Baudenbacher, H. Vali, N. T. Peters, F. A. Macdonald, and J. P. Wikswo, Science 290, 791 (2000).

B. P. Weiss, H. Vali, F. J. Baudenbacher, J. L. Kirschvink, S. T. Stewart, and D. L. Shuster, Earth and Planetary Science Letters 201, 449 (2002).

T. S. Lee, Y. R. Chemla, E. Dantsker, and J. Clarke, IEEE Trans. Appl. Supercond. 7, 3147 (1997).

M. B. Ketchen, D. D. Awschalom, W. J. Gallagher, A. W. Kleinsasser, R. Sandstrom, J. R. Rozen, and B. Bumble, IEEE Trans. Magn. 25, 1212 (1989).

D. J. Stanton, J. P. Wikswo Jr., Magnetic Inverse Method for Determination of Anisotropic Electrical Conductivities in a Two-Dimensional Cardiac Bidomin, IOS Press, Amsterdam, The Netherlands, 1995.

J. P. Wikswo Jr., in: R. W. Fast (Ed.), High-Resolution Measurements of Biomagnetic Fields, vol. 33, Plenum, N.Y., 1988, pp.107–116.

T. S. Lee, E. Dantsker, J. Clarke, Rev. Scientific Instrum. 67 (12) (1996) 4208.

C. S. Henriquez, Crit. Rev. Biomed. Engng. 2 (1) (1993) 1.

B. J. Roth, J. P. Wikswo Jr., IEEE Trans. Biomed. Engng. 33 (4) (1986) 467.

B. J. Roth, J. P. Wikswo Jr., IEEE Trans. Biomed. Engng. 41 (3) (1994) 232.

S.-F. Lin, J. P. Wikswo Jr., J. Biomed. Opt. 4 (2) (1999) 200.

B. J. Roth, N. G. Sepulveda, J. P. Wikswo Jr., J. Appl. Phys. 65 (1) (1989) 361.

N. G. Sepulveda, B. J. Roth, J. P. Wikswo Jr., Biophys. J. 55 (5) (1989) 987.

J. P. Barach, J. P. Wikswo Jr., IEEE Trans. Biomed. Engng. 41 (10) (1994) 969.

In order to provide high resolution imaging employing SQUID apparatus, it is important to have close tolerance spacing between the sensor being or using a SQUID device and the sample under investigation. In this regard, reference may be made to U.S. Pat. Nos. 5,491,411 and 5,894,220, which are incorporated herein by reference. In the patented systems, the entire SQUID device must be moved relative to a window separating the SQUID sensor and the sample. Such an adjustment apparatus does not lend itself to extremely close tolerance spacing between the SQUID sensor and the sample.

Another problem associated with the patented systems is that with such close tolerance spacing, it is important to maintain the window of the SQUID and the platform for supporting the room-temperature sample in a parallel relationship. Also, the patents do not disclose the manner in which the sensor is connected or matched to the system to provide the desired high resolution imaging.

Thus, it would be highly desirable to provide a new and improved high resolution imaging system.

Superconducting quantum interference device (SQUID) magnetometers have surpassed energy sensitivity and have been used to provide images of the magnetic field distributions associated with nerve and muscle action currents (see the Wikswo, et al. article), development currents in the chick embryo (see first-mentioned Thomas, et al. article), remnant magnetization in geological thin sections (see the second-mentioned Thomas, et al. article) currents in integrated circuits (see the Chatraphorn, et al., article), trapped flux in superconductors (see the Kirtley, et al. article), motion of magnetotatic bacteria (see the Chemla, et al. article), cracks and defects in metals (see the Weinstock, et al. and the Cochran, et al. articles), ongoing corrosion activity (see the Abedi, et al. article), and Johnson noise (see the Varpula, et al. article). Scanning SQUID microscopes are limited by the often-conflicted demands for high field sensitivity, which requires large sensing volumes and low noise SQUIDs, and high spatial resolution, requiring small sensing volumes, in close proximity to the sample.

One of the often-stated advantages of high-temperature superconductivity (HTS) over the more advanced low-temperature superconductivity (LTS) is that the higher operating temperature, typically around 77 K, allows HTS SQUIDs to be placed in closer proximity to room temperature samples than LTS ones with their lower operating temperature (4–10 K). In this regard, scanning SQUID magnetometers have achieved separations between the 4 K sensor and a room-temperature sample of only 1 to 2 mm for some applications, with comparable spatial resolution (see the Crum, et al. article). The most notable successes for LTS SQUID microscopes in terms of spatial resolution and sample to sensor spacing have had the SQUID apparatus and the sample both cooled to cryogenic temperatures and in a common vacuum space (see the Buchanan, et al. article). In contrast, HTS SQUID microscopes have achieved 15–50 micrometer separations typically and 50 micrometer spatial resolution (see the Black, et al. and the first Lee, et al. articles). However, because of their higher operating temperature, HTS SQUIDS have intrinsic noise levels at 1 kHz that are a factor of 4 to 5 higher than that of LTS SQUIDs (see the Tesche, et al. article). Unfortunately, HTS SQUIDs may suffer from excess 1/f noise associated with flux motion in the bulk superconductor and critical current fluctuations in the Josephson junctions (see the Dantsker, et al. article). Hence HTS SQUIDs have not yet always provided the combined low-frequency sensitivity and high spatial resolution required for magnetic imaging of many applications, such as bioelectric currents in living tissue and weak remnant magnetization in geological specimens.

Important technological features for some applications for both LTS and HTS SQUID microscopes is to locate the cryogenic SQUID apparatus in vacuum behind a thin room-temperature window (see, for example, the Buchanan, et al. and the Black, et al. articles). The SQUID apparatus is cooled by a high thermal conductivity link to a cryogen reservoir in the same vacuum space. While the vaporization enthalpy of liquid nitrogen is a factor of approximately 34 greater than that of liquid helium, for HTS microscopes this advantage may be only partly offset by a lower thermal conductivity of a typical thermal-link materials at 77 K as compared to 4 K. The thermal conductivity ratio for copper increases by a factor of 27 whereas that for sapphire decreases by a factor of 10 [$\kappa_{Cu}(4\ K)/\kappa_{Cu}(77\ K)=16200/600=27$ compared to $\kappa_{sapphire}(4\ K)/\kappa_{sapphire}(77\ K)=110/1100=0.1$]. The radiative heat load delivered to the SQUID from the room temperature window and surrounding hardware is independent of the window-to-SQUID separation and is essentially the same for HTS and LTS microscopes (within about 2% for some applications). These numbers suggest that the thermal design for an LTS microscope is only slightly more challenging than for an HTS SQUID microscope. This, coupled with the fact that the lower intrinsic and I/f noise of LTS SQUIDs can provide better sensitivity especially in the low frequency range (<1 Hz) than HTS SQUIDs, provides strong motivation for developing a high-resolution LTS SQUID microscope.

Electric currents play a key role in a wide range of biological phenomena. One of the most important findings from our experimental and theoretical studies is that the ability to measure cellular action currents directly, without assumptions regarding tissue conductivities or anisotropies, can provide new and valuable insights into a number of areas. See, for example, the first mentioned Wikswo, et al article. These include the interplay between tissue properties, electric fields and currents, and the propagation of electrical activity in multicellular systems, especially those with anisotropies in their electrical conductivities. There are a number of poorly understood phenomena in cardiac electrophysiology resulting from unequal tissue anisotropies and heterogeneieties. Theoretical analysis indicates that magnetic discrimination between models describing these phenomena is most accurate at spatial frequencies above 1 mm$^-$ (See the forementioned Staton, et al article.) Furthermore, bioelectric sources of magnetic fields are often distributed over a region of this scale. In order to measure these fields, for some applications it may be important to have a field sensitivity on the order of a few 100 fT Hz$^{-1/2}$ at frequencies from about 1 Hz to 1 kHz (see the second Wikswo, et al article). This may be achieved by low temperature superconducting quantum interference device (SQUID) magnetometers with the required spatial resolution. In order to obtain high spatial resolutions a 4.2 K sensor must be placed in close proximity to the room temperature sample, typically at distances comparable to the spatial resolution. As hereinafter described in greater detail, a scanning SQUID microscope (SSM) is optimized for imaging biomagnetic fields and present initial measurements of magnetic fields associated with current injection and the propagation of action currents in cardiac tissue.

DESCRIPTION OF DRAWINGS

The following is a brief description of the accompanying drawings:

FIG. 7(a) is an image produced by the microscope of FIG. 1;

FIGS. 7(b) and 8 are graphs useful in understanding the operation of the microscope of FIG. 1;

FIG. 11(a) is a diagram of a heart illustrating the imaging area for a given experiment using the microscope of FIG. 9;

FIG. 11(b) is an MCG graph useful in understanding one example of the present invention;

FIGS. 12 and 13 illustrate examples of images produced by the microscope of FIG. 9;

FIGS. 14–21 are diagrams of various detection coils.

FIG. 22 is a graph of the response of gradient coil sensitivity relative to the response of a magnetometer.

FIG. 23 is a graph of the response of a magnetometer and axial gradiometer to a magnetic dipole.

FIG. 24 is a graph of the response of a magnetometer and axial gradiometer to a current source.

FIGS. 25–31 are methodologies of magnetic measurements without and with applied magnetic fields.

FIG. 32 is a plan view of an embodiment of a fractional-turn SQUID magnetometer

FIG. 33 is a circuit diagram of a SQUID magnetometer.

FIG. 34 is a circuit diagram of a fractional-turn SQUID magnetometer.

FIG. 35 is a circuit diagram of a SQUID magnetometer having an extended pickup loop in series with the Josephson loop.

FIG. 36 is a circuit diagram of a bare SQUID magnetometer.

DETAILED DESCRIPTION OF CERTAIN EXAMPLES OF THE PRESENT INVENTION

Figure 1:
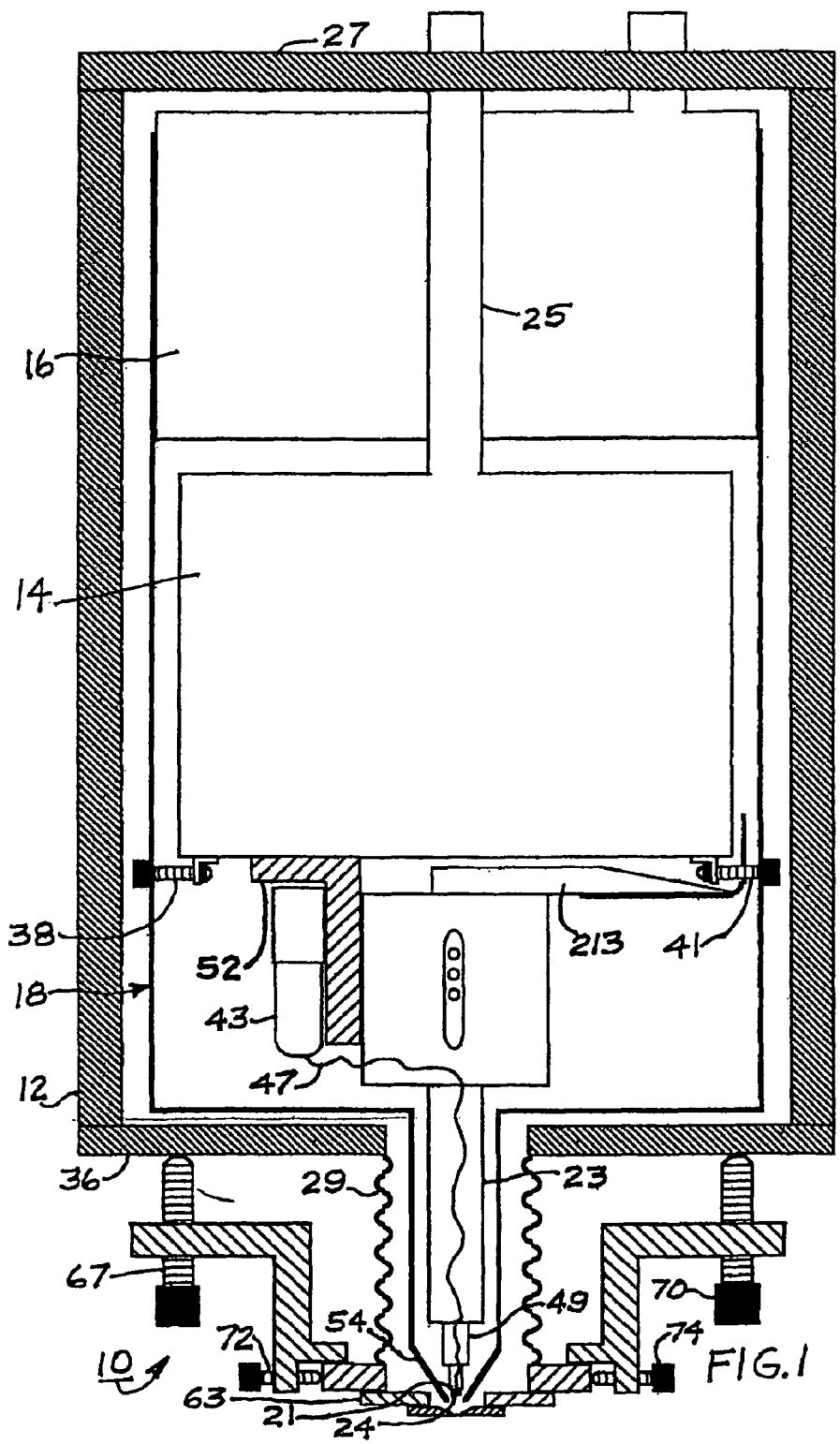
FIG. 1 is a diagrammatic sectional elevational view of a SQUID microscope constructed in accordance with an example of the present invention.

The following description is organized according to the following outline:
A) SYSTEM OVERVIEW
B) SQUID MICROSCOPE DESIGN—GENERAL DESCRIPTION
C) CRYOGENIC DESIGN
D) DEWAR TAIL AND WINDOW CONSTRUCTION
E) PICKUP COIL
E) SCANNING AND LEVELING STAGES
F) MAGNETIC SHIELDING
G) CALIBRATION AND DATA ACQUISITION
H) OPERATION OF DISCLOSED EMBODIMENT
I) IMAGING ACTION CURRENTS IN CARDIAC TISSUE
J PICKUP COIL POSITIONAL ADJUSTMENT
K IMAGING ACTION CURRENTS IN CARDIAC TISSUE
L) EXPERIMENTAL METHOD
M) ALTERNATIVE DETECTION COILS
N) DETECTION COIL MODULARITY The foregoing organization outline is used only for the purpose of facilitating the organization of the description and is not intended to limit the interpretation of the appended claims.

A) System Overview

According to one example of the invention, a high resolution SQUID microscope is provided and enables close spacing to a room-temperature sample.

According to one tentative aspect of an embodiment of the invention, a thin window construction is used to enable a SQUID sensor to be positioned in close proximity to the sample under inspection. As to a tentative detailed example of such a thin window construction, a thin window plate is affixed to a thick window plate having a hole therein. As to a more detailed example, the thick window has a conical shaped well.

Other tentative features of the disclosed embodiment of the invention relate to using a mechanism for causing the window and the sensor, as well as other components, to assume a substantially parallel configuration. In one disclosed embodiment of the invention, the sensor is in the form of a coil which is wound with fine conductor wire.

According to another example of a SQUID microscope constructed according to the invention, a microscope images weak magnetic fields using submillimeter pickup coils made from conventional low-temperature superconducting wire such as niobium wire coupled to the input circuit of a superconducting quantum interference device (SQUID). According to an example of the invention, the pickup coil and the SQUID sensor are mounted in the vacuum space of the cryostat and are thermally anchored to the liquid helium reservoir. In one example, a 25 micrometers thick sapphire window separates the room temperature (RT) sample and the vacuum space. According to that example, the spacing between the pickup coil and RT sample was typically less than 130 micrometers. The spatial resolution is limited by the diameter of the pickup coil. The pickup coils are relatively easily interchangeable, allowing the SQUID microscope to be adapted to a variety of different measurements. A spatial resolution of 250 $\mu$m has been achieved with a magnetic field sensitivity of 850 fT $Hz^{1/2}$ or a spatial resolution of 500 $\mu$m with a magnetic field sensitivity of 330 fT $Hz^{1/2}$. This instrument may be used to measure various fields such as biomagnetic and paleomagnetic fields.

According to one example of the invention, a scanning superconducting quantum interference device (SQUID) microscope images magnetic fields of room-temperature samples with sub-millimeter resolution. Hand-wound niobium pickup coils may be coupled to commercially available low temperature SQUID sensors according to one example of the invention. The SQUID sensor and the pickup coil are located in the vacuum space of the cryostat and are separated by a 25 $\mu$m sapphire window from the room-temperature sample. The spacing between the tip of the pickup coil and the sample is typically <100 $\mu$m. In some examples of the invention, pickup coil diameters of 250 and 500 $\mu$m with various numbers of turns depending on the desired spatial resolution have been employed. For example, a 500 $\mu$m diameter pickup coil achieved a field sensitivity of about 330 fT $Hz^{-1/2}$ for frequencies above 1 Hz. This allows the recordation of magnetcardiograms (MCGs) on the surface of an isolated Langendorff perfused rabbit heart according to one experiment performed. MCGs at 1600 locations on a 16×16 $mm^2$ grid on the surface of an isolated rabbit heart stimulated with a point electrode in the center of the grid have been recorded. The MCGs were combined to produce a time series of two-dimensional magnetic field maps, which show a clear, octopolar pattern during the current injection, a similar pattern with a reversal in currents immediately after current injection, and the generation and propagation of an elliptical action-current wave front.

According to the disclosed embodiment of the present invention, a low-temperature superconductivity (LTS) SQUID microscope is provided. Important technological features for some applications for both LTS and HTS SQUID microscopes is to locate the cryogenic SQUID apparatus in vacuum behind a thin room-temperature window (see, for example, the Buchanan, et al. and the Black, et al. articles). The SQUID apparatus is cooled by a high thermal conductivity link to a cryogen reservoir in the same vacuum space. While the vaporization enthalpy of liquid nitrogen is a factor of approximately 34 greater than that of liquid helium, for HTS microscopes this advantage may be only partly offset by a lower thermal conductivity of a typical thermal-link materials at 77 K as compared to 4 K. The thermal conductivity ratio for copper increases by a factor of 27 whereas that for sapphire decreases by a factor of $10[\kappa_{Cu}(4\ K)/\kappa_{Cu}(77\ K)=16200/600=27$ compared to $\kappa_{sapphire}(4\ K)/\kappa_{sapphire}(77\ K)=110/1100=0.1]$. The radiative heat load delivered to the SQUID from the room temperature window and surrounding hardware is independent of the window-to-SQUID separation and is essentially the same for HTS and LTS microscopes (within about 2% for some applications). These numbers suggest that the thermal design for an LTS microscope is only slightly more challenging than for an HTS SQUID microscope. This, coupled with the fact that the lower intrinsic and 1/f noise of LTS SQUIDs can provide better sensitivity especially in the low frequency range (<1 Hz) than HTS SQUIDs, provides strong motivation for developing a high-resolution LTS SQUID microscope.

Electric currents play a key role in a wide range of biological phenomena. One of the most important findings from our experimental and theoretical studies is that the ability to measure cellular action currents directly, without assumptions regarding tissue conductivities or anisotropies, can provide new and valuable insights into a number of areas. See, for example, the first mentioned Wikswo, et al article. These include the interplay between tissue properties, electric fields and currents, and the propagation of electrical activity in multicellular systems, especially those with anisotropies in their electrical conductivities. There are a number of poorly understood phenomena in cardiac electrophysiology resulting from unequal tissue anisotropies and heterogeneieties. Theoretical analysis indicates that magnetic discrimination between models describing these phenomena is most accurate at spatial frequencies above 1 mm$^-$ (See the forementioned Staton, et al article.) Furthermore, bioelectric sources of magnetic fields are often distributed over a region of this scale. In order to measure these fields, for some applications it may be important to have a field sensitivity on the order of a few 100 fT Hz$^{-1/2}$ at frequencies from about 1 Hz to 1 kHz (see the second Wikswo, et al article). This may be achieved by low temperature superconducting quantum interference device (SQUID) magnetometers with the required spatial resolution. In order to obtain high spatial resolutions a 4.2 K sensor must be placed in close proximity to the room temperature sample, typically at distances comparable to the spatial resolution. As hereinafter described in greater detail, a scanning SQUID microscope (SSM) is optimized for imaging biomagnetic fields and present initial measurements of magnetic fields associated with current injection and the propagation of action currents in cardiac tissue.

B) Squid Microscope Design-General Description

In order to obtain high spatial resolutions the sensor is placed in close proximity to the room temperature sample for some applications, typically at distances comparable to the spatial resolution. (See the Wikswo, et al. article). Hence the major challenges are to bring and maintain a close spacing between the sensor at low temperature (about 4.2 K) and the sample at room temperature. Therefore, the sensor is placed in the vacuum space behind a thin sapphire window. The sensor is maintained at cryogenic temperatures in the vacuum space in close proximity to the room temperature sapphire window. The sample is scanned in close proximity to the window. The instrument is magnetically shielded from environmental noise.

C) Cryogenic Design

Referring now to the drawings and more particularly to FIG. 1 thereof, there is shown a low-temperature SQUID microscope 10, which is constructed according to preferred embodiment of the invention. The microscope 10 includes a dewar 12 contains two stacked reservoirs 14 and 16. The lower reservoir 14 contains liquid helium and the upper reservoir 16 contains liquid nitrogen. The 3.2 liter nitrogen tank or reservoir 14 is thermally linked to an aluminum radiation nitrogen shield generally indicated at 18 that surrounds the 1.9 liter helium reservoir 14 and extends downwardly to the tip or distal end 21 of the cryostat or cold finger 23, shielding the interior against thermal radiation from the surrounding walls. By having the shield 18 extend to the tip 21, a SQUID pick-up coil 24 is facilitated to be positioned in a closely spaced relationship to a room-temperature sample to be inspected. The nitrogen shield 18 is further wrapped in multiple layers of aluminized mylar superinsulation to reduce the thermal load due to radiation on the liquid nitrogen shield and therefore makes the operation of the sensor possible and also increases the hold time of the nitrogen contained in the reservoir. The helium reservoir 14 is supported by its fill tube 25, which provides a rigid mechanical connection to a top plate 27. Similarly, the nitrogen reservoir 16 is attached to the top plate 27 by its fill tube, and a flexible brass bellows 29 is connected at the bottom of the reservoir to help avoid mechanical stress due to differential thermal contraction. To help add more mechanical stability to the nitrogen reservoir 16 and the shield 18, there are a plurality of horizontal glass fiber rods such as rods 38 and 41. The heat load on the helium reservoir 14 imposed by the mechanical support structure is about 20 mW. The glass fiber rods contribute about 10 mW, and the fill tube 25 and nitrogen reservoir or tank 16 approximately 5 mW each.

A SQUID sensor 43 is housed in a niobium container in the vacuum space of the cryostat 23 and is thermally anchored to the helium reservoir 14. The SQUID sensor 43 and its readout electronics (not shown) may be purchased from Quantum Design, San Diego, Calif. A low thermal conductance transmission line (not shown) and a vacuum feed-through (not shown) are used to connect the SQUID sensor 43 in the vacuum space of the cold finger 23 to a preamplifier (not shown) of the flux-lock-loop electronics (not shown). In the preferred embodiment example, an experimental model was tested using two twisted pairs of wires (not shown) were installed in the same way for monitoring the temperature with low temperature sensing diodes (not shown) at various locations during the initial testing. The heat load from the electrical connections to the room temperature top plate on the helium reservoir 14 is negligible or small since they have low thermal conductance and they get pre-cooled by wrapping them around the helium fill tube.

Figure 2A:
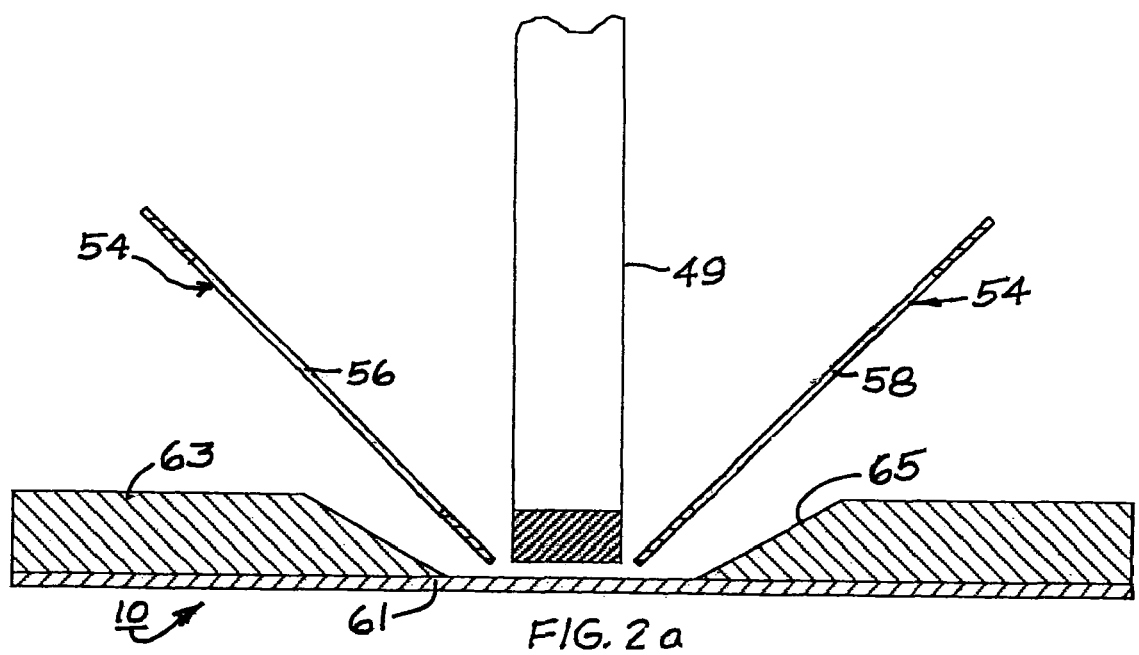
FIG. 2a is a diagrammatic cross-sectional view of a tip of the microscope.

In order to couple external magnetic flux to the SQUID sensor 43, the pickup coil is connected to the input terminals of the SQUID sensor 43 via line 47. The pickup coil 24 of the present example was wound from 25 μm thick niobium titanium (Nb-Ti) wire onto a sapphire bobbin 49 with a tip diameter of either 250 or 500 μm, depending on the spatial resolution and field sensitivity requirements. From the pickup coil 24 to the input terminals of the SQUID sensor 43, the line 47 comprises the Nb–Ti wire twisted as a pair and shielded in a lead tube to provide the required spatial separation between sensing volume and the SQUID sensor 43 without detecting stray magnetic fields. The pickup coil 24 is glued to the sapphire bobbin 49 with a thin layer of cyanoacrylate. As best seen in FIG. 2(*a*), the sapphire bobbin 49 is thermally anchored to the helium reservoir 14 with the copper cold finger 23. The details of the sapphire bobbin 49 and the tip 21 of the nitrogen cooled aluminum shield 18 are shown schematically in FIG. 2(*a*). The cold finger 23 is fabricated from oxygen-free, high-conductivity copper (OFHC) and is used to cool the SQUID sensor 43, the lead tubing line 47 and the sapphire bobbin 49. In the preferred embodiment, the main body of the sapphire bobbin 49 is 3.1 mm in diameter and 30 mm long. The diameter of the bobbin 49 is reduced over a length of 5 mm in two steps, first to an intermittent diameter of 1 mm, and then for the coil 24 a final diameter of either 250 or 500 μm. The bobbin 49 is clamped to the tip of the cold finger 23. The lead tubing line 47 is guided through a hole (not shown) in the cold finger 23 directly into the Nb SQUID sensor 43 that is housed inside the copper structure at the base. The cold finger 23 is finally screwed to a cold plate 52 of the helium reservoir 14. In general, a thin layer of Apiezon N grease may be used in situations where a high thermal conductance between different components may be important.

The entire structure starting at the tip 21 of the sapphire bobbin 49 with the pickup coil 24 is wrapped in multiple layers of aluminized mylar for radiation shielding. As shown in FIG. 2(*a*) the sapphire bobbin 49 is surrounded by a conical shaped extension of the previously described nitrogen shield 18. The extension 54 of the nitrogen shield 18 to the very tip 21 and the layer of aluminized mylar on the sapphire tip are both crucial for the cooling of the pickup coil 24 below the transition temperature. The measured temperature of the cold finger 23 at the height of the sapphire bobbin 49 is about 4.2 K, even if the pickup coil 24 is exposed to a large solid angle and is therefore not superconducting. This indicates that the heat flow is limited by the diameter of the distal end of the sapphire bobbin 49, consistent with an analysis based upon the thermal conductance and the diameter of the sapphire bobbin. A non-superconducting coil can be easily diagnosed either by the absence of a response to a dc magnetic field or an elevated white noise level of the SQUID sensor itself.

Once the pickup coil 24 is superconducting and exhibits a response to the dc magnetic field, the white flux noise level may be about 4 .mu.0/Hz–½, indicating negligible noise contributions from the pickup coil 24 or surrounding metallic structures. The conical aluminum nitrogen shield extension 54 surrounding the pickup coil 24 may include a plurality of longitudinally extending slots such as slots 56 and 58 (FIG. 2*a*), in order to prevent or reduce circular currents in the plane of the pickup coil. The cone extension 54 may be composed of aluminum material, or of a machined G-10 fiber-composite material, or coil foil. When composed of the G-10 fiber-composite material, thin copper strips may be anchored to the lower part of the nitrogen shield. Calculations demonstrated that the Nyquist noise contribution (see the Clem article) of the cold finger, nitrogen shield, window mechanism, and cryogen tanks was less than the intrinsic noise levels of the SQUID apparatus coupled to the pickup coil.

D) Dewar Tail and Window Construction

Referring now to FIG. 2(*a*), in order to help realize a close proximity of the pickup coil 24 and the room temperature sample according to an embodiment of the invention, a thin sapphire window 61 is used to separate the vacuum space from atmospheric pressure. The 25 μm thin sapphire window 61 is supported by an inner thick backing window 63, which overlies the thin window 61 on the vacuum side thereof to help support it structurally. The thick window 63 may be 1 mm thick and composed of sapphire. The thick window 63 is annular in shape and has an outer diameter of 25 mm and a 1.5 mm inner diameter that tapers to a diameter of 9 mm on the vacuum side of the window 63, as shown in FIG. 2(*a*). The tapered central hole 65 enables the nitrogen shield conical extension 54 to surround the coil 24 in close proximity to the window 61, therefore reducing the radiation load.

The 1.5 mm hole diameter was chosen in order to minimize the bowing of the 25 μm sapphire thin window 61 due to the atmospheric pressure. According to Lee et al., (see the first Lee article) the bowing b can be calculated using $$(1 + 0.488 \cdot b^2/t^2) \cdot \frac{b}{t} = 0.188 \cdot P \cdot (1 - v^2) \cdot \frac{a^4}{E \cdot t^4} \qquad (1)$$

where t is the thickness of the window, P the pressure difference across the window, a the window radius, v the Poisson's ratio, and E the Young's modulus. For the example of the design of the invention as build and tested, conditions of a =0.75 mm, E=345 Gpa, v=0.3, t=25 micrometers, and P=101.3 kPa, the above equation predicts a bowing of just over 1 micrometers. No bowing could be detected with a dial indicator with 10 micrometers resolution.

As best seen in FIG. 1, the position of the window relative to the stationary pickup coil 24 can be adjusted with micrometer screws and the flexible brass bellow 29. There are three vertical adjustment screws such as screws allow for adjusting the tilt and the spacing between the pickup coil 24 and the thin sapphire window 61, whereas three horizontal screws such as screws 72 and 74 are required to center the pickup coil 24 within the hole 65 (FIG. 2(*a*)) of the backing window 63. The distance between the pickup coil 24 and the sapphire window 61 is determined by measuring the required vertical movement of the objective of an inverted microscope when focusing on the pickup coil and subsequently on the inner surface of the sapphire window. Typical operational distances between the coil 24 and the sapphire window 61 are about 50 μm but can be as low as 25 μm for a limited period of time. The stability can be enhanced with a more rigid construction of the dewar 12 and a firm anchoring of the helium and nitrogen reservoirs to the outer casing, which might lead to reduced thermal efficiency for the cryostat 23.

E) Pickup Coil

Figure 2B:
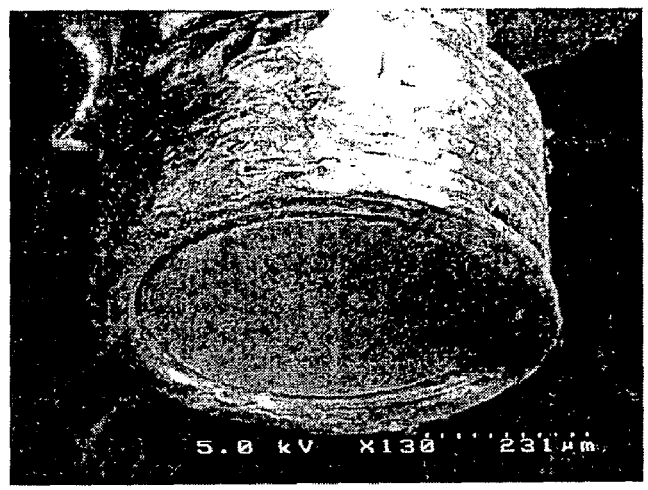
FIG. 2b is a scanning electron microscope image of a pick-up coil for the microscope of FIG. 1.

According to one example of the present invention, the pickup coil 24 is hand-wound with 25 μm insulated Nb–Ti wire on the tip of the sapphire bobbin 49. In general, coils may be used with two layers of multiple turns, where the second layer brings the wire back to the starting position and reduces the sensitivity of the system to traverse magnetic fields. In some applications, where high field sensitivity was required, four layer coils on a 500 $\mu$m diameter bobbin may be used. The individual layers are fixed to the sapphire bobbin 49 with cyanoacrylate. A scanning electron microscope image of a pickup coil is shown in FIG. 2(b). In order to prevent the introduction of additional flux into the input circuit of the SQUID sensor, the coil leads 47 (FIG. 1) are twisted and threaded through a thin lead tube from the pickup coil 24 into the niobium SQUID housing of the cryostat 23. Multiple layers of crinkled aluminized mylar foil are tightly wound onto the final layer of the coil for radiation shielding.

The flux induced into the pickup coil 24 is converted by the SQUID sensor 23 and its feedback electronics into a voltage directly proportional to the flux. The magnetic flux is the product of field strength B and the coil area A times the number of turns, such that the smaller the pickup coil, the lower its absolute field sensitivity and the higher its spatial resolution. In order to optimize or at least improve the pickup coil design, a detailed simulation of the images were conducted that may be obtained from particular sources of interest. The SQUID microscope 10 is designed to image magnetic fields from distributed, biological currents sources such as cardiac depolarization wave fronts or action currents in nerve fibers or single plant cells. A current-carrying wire as the source of the magnetic field optimizes or at least improves the pickup coil. The microscope 10 may be used for many other applications as well. Similar calculations may be done using magnetic dipoles for distribution of ferromagnetic particles or brecciated thin sections of rocks, which are generally composed of grains with individual magnetization, or current dipoles for cellular bioelectric sources. The calculations use the energy sensitivity and the fixed input inductance of the commercial SQUID sensor as boundary conditions.

For detailed description of the fundamentals of SQUID-based instruments, refer to the articles by Clarke, and by Kirtley et al. In the present example of the inventive system, the pickup coil 24 is directly connected to the input coil forming a superconducting flux transformer circuit. A magnetic flux applied to the pickup loop, $\delta\phi_p$, results in a screening current, Js in the input circuit. Flux quantization requires that $$\delta\phi_p + (L_i + L_p) \cdot J_s = 0 \quad (2)$$

where $L_I$ is the inductance of the input transformer and $L_p$ the inductance of the pickup coil. The influence of currents flowing in the input circuit on the SQUID and vice versa have been neglected. In the limit of an infinitesimal small flux, or the SQUID being in the flux-locked loop, the amount of flux introduced into the SQUID, $\delta\phi_p$, is given by $$\delta\phi_s = M_i \cdot |J_s| = \frac{M_i \cdot \delta\phi_p}{(L_s + L_p)} \quad (3)$$

where $M_i$ is the mutual inductance between the input coil and the SQUID. The mutual inductance is $$M_i = \alpha \cdot \sqrt{L_s L_i} \quad (4)$$

where $\alpha$ is the coupling constant and $L_s$ the inductance of the SQUID. This allows us to rewrite Eq. (3) to $$\delta\phi_s = \frac{\alpha \sqrt{L_s \cdot L_i} \cdot \delta\phi_p}{(L_i + L_p)}, \quad (5)$$

The minimum flux detectable at the pickup coil 24 is obtained by equating the square of $\delta\phi_s$ with the equivalent flux noise of the SQUID, $S_\phi = 2 \cdot \epsilon_s \cdot L_s$, where $\epsilon_s$ is the equivalent noise energy of the SQUID. Hence Eq. (5) is solved for $\delta\phi_p$ and square the result to obtain $S_\phi(p)$, the spectral density of the equivalent flux noise referred to the pickup coil such that $$S_\phi^{(p)} = \frac{2 \cdot (L_i + l_p)^2 \cdot \varepsilon}{L_i \cdot \alpha^2} \quad (6)$$

The corresponding minimum detectable magnetic field is given by $$B^{(p)} = \frac{\sqrt{S_\phi^{(p)}}}{n \cdot \pi \cdot r_p^2}, \quad (7)$$

where $r_p$ is the radius of the pickup coil an n the number of turns.

Equations (6) and (7) may be used to calculate the field sensitivity of the coil geometries. The minimum detectable magnetic field has a minimum for $L_i = L_p$. One example of the disclosed embodiment of the SQUID microscope 10 has a fixed input coil impedance of $L_i = 1.86$ $\mu$H, which is not matched to typical inductances of approximately 0.1 $\mu$H for a 20 turn pickup coil on a 500 $\mu$m diameter bobbin in order to obtain maximum sensitivity. The energy sensitivity is $\epsilon = 3.6 \times 10-31$ J/Hz.

To convert the minimum detectable magnetic field into a minimum detectable current in the wire, the total flux of the pick up coil is calculated at a fixed height. The total flux is the sum of the fluxes from each turn of the coil. Each turn is treated as an individual plane at a different height. The flux of a single turn results from integrating the field over the area. For the integration, the area may be developed and divided into a grid of 50 distributed area elements (see the Roth, et al., article). The field in the center of each element was calculated using the law of Biot-Savart.

Figure 3:
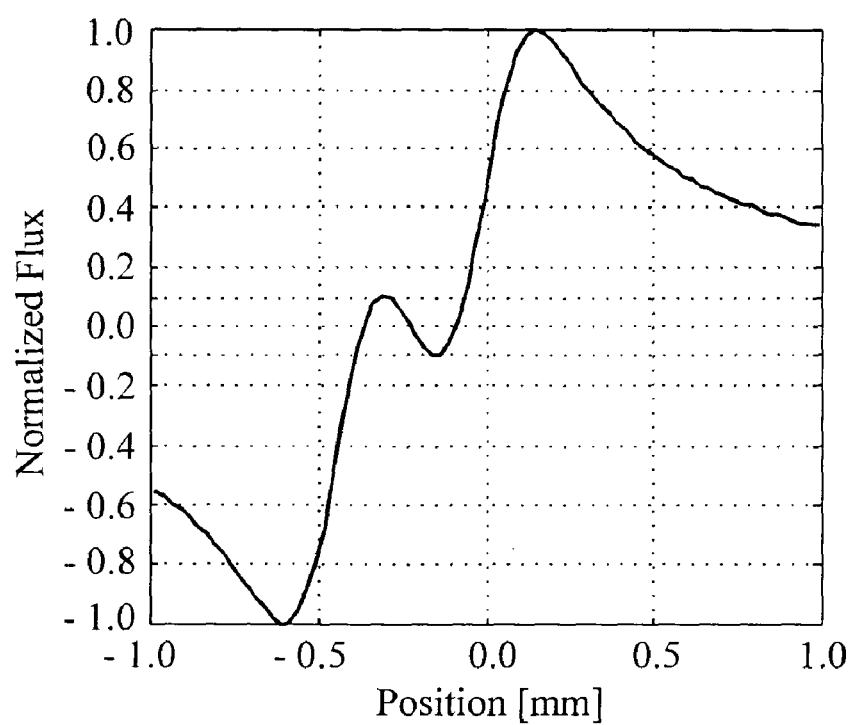
FIGS. 3 and 4 are graphs useful in the understanding of the microscope of FIG. 1.

In order to estimate the spatial resolution there is calculated the flux induced into the pickup coil by two parallel wires separated a distance d as a function of position perpendicular to the wires at a fixed height of 100 $\mu$m. FIG. 3 shows the normalized flux as a function of position for a cylindrical pickup coil diameter of 250 $\mu$m scanned at a height of 100 micrometers across two parallel wires carrying identical currents. The two wires can be separated if the two peaks can be discerned near the zero crossing. If the signal-to-noise ratio is fixed, the minimum detectable separation distance d is defined as the value of d for which the central peaks are 10% of the maximum signal, which corresponds to a signal-to-noise ratio of 5:1, rather than using the conservative Rayleigh criterion used previously. (see the Tan, et al., article)

Figure 4:
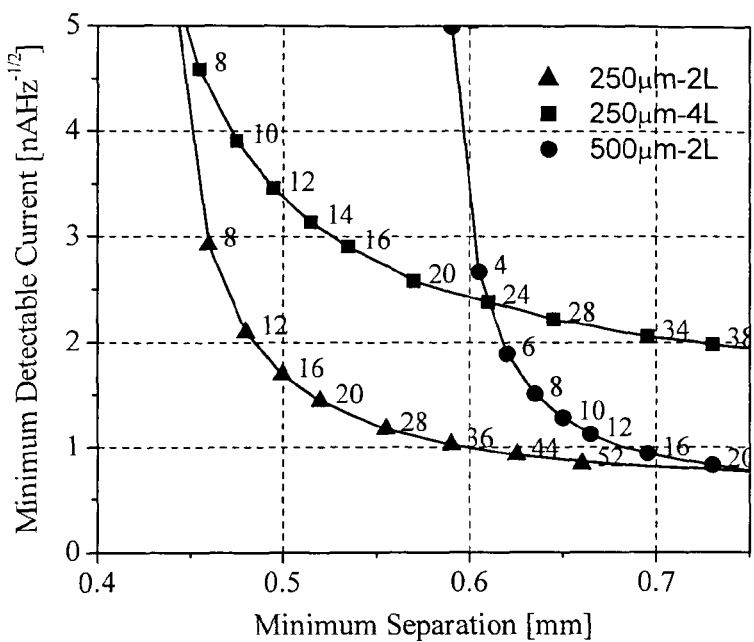

In the present example of the inventive cylindrical pickup coil design, the minimum detectable separation depends upon the coil configuration because the height of the coil depends on the number of turns and the diameter depends on the number of layers. In order to find the minimum detectable separation for a desired minimum detectable current, simulations may be conducted with various coil geometries at a height of 100 µm. The results, shown in FIG. 4, may be used to determine the desired pickup coil design for a particular application. FIG. 4 illustrates the minimum detectable current as a function of minimum separation for different pickup coil sizes and geometries. The minimum detectable separation is defined as the ability to distinguish two parallel wires carrying identical currents using a 10% peak criterion. The symbols represent three cylindrical pickup coil geometries with different diameters. The square symbol is 250 micrometers diameter and two layers. The circle symbol is 500 micrometers diameter and two layers. The triangle symbol is 250 micrometers diameter and four layers. The designations near the symbols indicate the number of turns.

The data for the enclosed embodiment show a good performance of the four-layer coil on a 250 µm diameter bobbin with a minimum detectable current of up to 0.9 nA/Hz½ with a reasonable number of turns. However, should the experiment require higher field sensitivities it is required to increase the diameter of the pickup coil. For high spatial resolutions less than about 250 µm, the number of turns may be reduced to achieve field sensitivities. Similar calculations may be conducted for a dipolar source characteristic. For the disclosed embodiment, qualitatively the minimum detectable separation may be smaller in this particular case.

Since the SQUID microscope 10 according to the disclosed embodiment of FIG. 1 is built for measurements of weak or steady bioelectric currents near dc or weak remnant magnetic field in rocks, the scanning platform should be made to avoid the introduction of magnetic contributions.

E) Scanning and Leveling Stages

Figure 5:
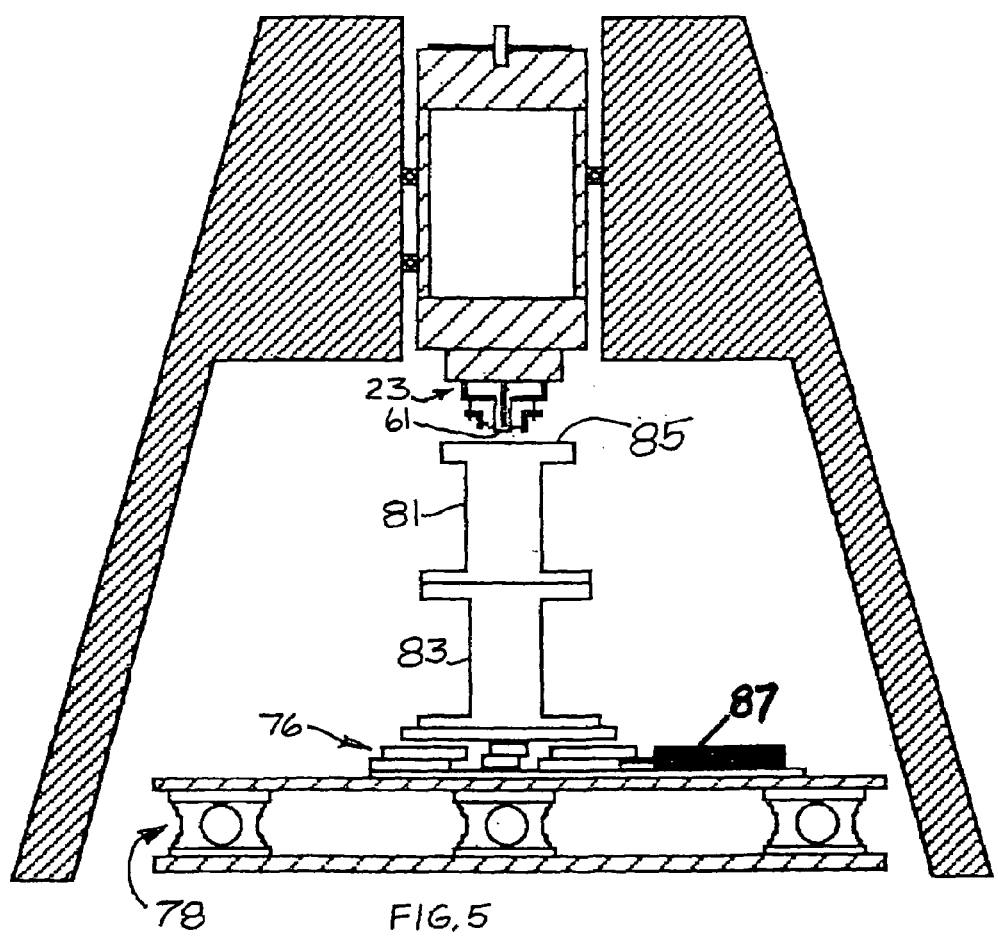
FIG. 5 is a diagrammatic front view of the microscope of FIG. 1.

In the disclosed embodiment, an XY-scanning stage 76 is mounted about 0.7 m below the sapphire window on a leveling stage 78. Two Plexiglas pedestals 81 and 83 may be used to extend a scanning table 85 to about 50 mm below the sapphire window. FIG. 5 schematically shows the setup. Both pedestals may be removed allowing maximum flexibility in sample preparation and SQUID servicing. The X-Y scanning stage 76 may be fabricated from G10-glassfiber composite. High precision linear bearing slides and precise machining help ensure that the scanning table does not change height during the scan. Two stationary custom made nonmagnetic piezoelectric inchworm motors generally indicated at 87 may be Burleigh TW 712-10 with high precision optical encoders (not shown) used to drive the stage. The scanning range may be 50 mm in each direction with an absolute resolution of 0.5 µm. Each motor is operated inside a separate µ-metal shield (not shown) and electrical connections (not shown) to the motors 87 run in copper pipes to ports in the wall of the shielded room (not shown). The extensive shielding is required to help ensure that the noise level does not increase during operation of the scanning stage 76.

The leveling stage 76 may be placed on the floor of the shielded room and is required to level the top of the scanning platform 85 relative to the sapphire window 61 of the cryostat and to adjust the scanning height for different samples. The leveling stage 76 is, in the preferred example, essentially a tripot arrangement using three stepper motors controlled by lab-jacks such as Newport-lab-jack 281. Each stepper motor such as S57102MO, Daedal, is connected to a microstepping drive amplifier (Zeta Drive, Daedal) controlled by the AT6400 indexer (Daedal). The stepper motors 87 control the height of each lab-jack to an accuracy of less than 10 µm and have a total range of movement of about 60 mm. Each lab-jack has physical limit switches for both the high and low limits. All distances are measured in the forward direction from the lower limit to eliminate backlash in the lab-jacks and universal joints.

A digital dial indicator (not shown) with computer readout such as a Mitutuyo Digimatic Indicator Series 543-611, can be attached to the sample platform to measure the distance from the platform to the window. By running the X-Y scanning stage 76, the digital indicator scans across the window 61 indicating height variations to within 10 µm. In this way, the height of an individual lab-jack can be adjusted with its stepper motor to insure that the sample platform 85 and the SQUID window 61 are substantially parallel, guarding against potential sample or window damage and helping to insure a uniform operating spacing between the top of the sample and the sapphire window of a few tens of micrometers.

F) Magnetic Shielding

In the disclosed embodiment actually built and tested, the SQUID microscope 10 may be housed in a three layer, µ-metal magnetically shielded room (Vacuumschmelze, Hanau) to climate near-zero and higher frequency noise sources. All electrical wires to the stage motors may run through two circular ports soldered to the copper piping inside the shield to eliminate high frequency noise. Inside the shield the 60 Hz noise is 250 fT in 1 Hz bandwidth and the ambient static field is less than 25 nT.

G) Calibration and Data Acquisition

The SQUID is operated in a flux-lock loop with commercial SQUID electronics such as Quantum Design DC-5000 controller. The SQUID electronics provide automatic tuning, manual selection of gain and bandwidth, and outputs a voltage proportional to the flux coupled into the pickup coil. The SQUID may be operated in a flux-lock loop range of $5\Phi_0$ and a bandwidth of 1 kHz, where $\Phi_0 = h/2e$ is the flux quantum. For quasistatic measurements, an additional low-pass filter of 1–10 Hz may be applied to the voltage output. Bandwidths of up to 50 kHz and flux-lock loop ranges of 0.5–500 $\Phi_0$ are possible for particular applications. The voltage-to-magnetic field calibration factor is measured by applying a known field with a set of Helmholtz coils.

The voltage may be digitized with a PCI-MIO card (National Instruments) with 16 bit resolution. In general, in the disclosed example, the system was over-sampled by at least a factor of 10 at a 1 kHz bandwidth selectable by the SQUID controller, since we are not limited by the sampling speed of the AD card. All motors and the SQUID electronics are interfaced by custom-made software written in LabVIEW (National Instruments) utilizing various software modules supplied by the manufacturers of the stepper motor controllers and the piezodriven scanning stage motors.

H) Operation of Disclosed Embodiment

The hold time for the 1.9 liter liquid helium reservoir is about 24 h, indicating a heat input to the helium reservoir of about 58 mW, or at least 53 mW. The heat leak to the helium reservoir from the nitrogen shield is about 5 mW, from the standoffs 10 mW, and from the helium fill tube neck 5 mW as measured by the manufacturer. The heat leak through the vacuum space with a background pressure of about $10^{-6}$ mbar is negligible. The only radiative hear load on the helium reservoir results from the hole in the conical nitrogen shield surrounding the sapphire bobbin and the pickup coil, which is calculated at about 38 mW. The tip of the coil 24 absorbs about 20% of this heat, which is estimated from the surface area ratios between the pickup coil 24 and 77 K shield opening. Therefore about 15 mW are absorbed at the tip. Since the temperature at the base of the sapphire bobbin 49 may be 4.2 K in one example of the microscope 10, the coil temperature may not be more than 5 K, taking into account the thermal conductance of sapphire and the diameter of the tip of the bobbin. In an instrument with a 250 $\mu$m diameter coil one could reduce the hole in the nitrogen shield 18 by a factor of 2, therefore increasing the hold time by about 8 h. Furthermore, the face of the bobbin 49 could be coated with a thin gold layer to increase the reflectance and reduce the absorption. However, since one loses about 1 l of helium cooling the helium transfer line it is more economical to increase the volume of the helium and nitrogen tank to increase the refill intervals to at least 48 h.

Figure 6:
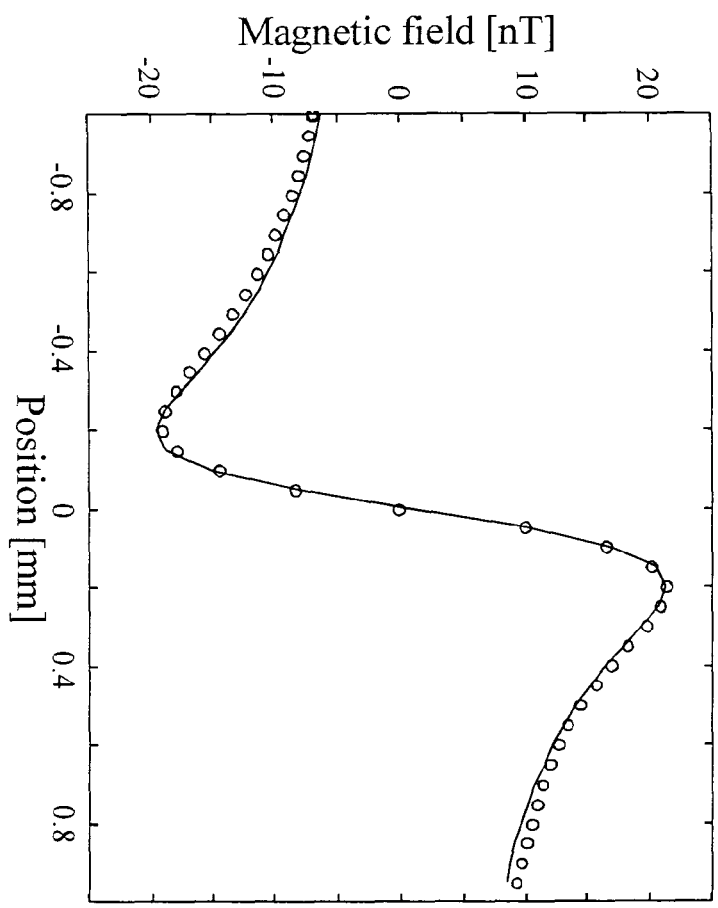
FIG. 6 is a graph useful in understanding the operation of the microscope of FIG. 1.

According to one example of an embodiment of the invention, in order to verify the distance between the sample and the pickup coil 24, a 150 mm long and 25 $\mu$m diameter straight copper wire carrying a static current of 36.7 $\mu$A was scanned beneath a two layer, ten turns (five turns per layer), 250 $\mu$m diameter pickup coil at a fixed height. The measured magnetic field generated by the current in the wire is shown as circles in FIG. 6. The solid line results from a fit through the data points taking into account the shape and height of the pickup coil. The only free parameter used was the wire-to-coil spacing. For the shown data the fit resulted in a wire pickup coil distance of 130 plus or minus 10 $\mu$m. The height was determined to be 130 plus or minus 10 micrometers.

According to the present example, the 130 $\mu$m separation is the sum of the coil-to-window distance, the thickness of the sapphire window, and the sample-to-window spacing. The 50 $\mu$m coil-to-window distance was measured with an inverted microscope. Given the window thickness of 25 micrometers, the sample-to-window spacing was on the order of 50 micrometers. A closer sample-to-coil spacing can be achieved with perfectly flat samples or biological tissue pressed lightly against the sapphire window. In the present example of an actual implementation of an embodiment of the invention, the main limitation on the sample-to-coil spacing arises from the relatively thick sapphire windows, the mechanical stability of the helium reservoir relative to the outer dewar casing, and the use of a cylindrical coil with a finite height. In general, in the present example, the present spatial resolution is limited mainly by the diameter of the pickup coil. Achieving a close sample-to-coil spacing essentially allows the height of the pickup coil to be extended with little or no degradation of the spatial resolution, therefore increasing the magnetic field resolution. Furthermore, the close sample-to-pickup coil spacing increases the signal strength, which is particularly important when imaging geomagnetic samples with a dipolar field that falls very quickly with distance. In regard to the present example of an actual implementation of an embodiment of the invention, by redesigning the support of the nitrogen reservoir within the dewar casing, strengthening the floor in the shielded room, inducing some vibration damping, and firmly guiding the helium transfer tube during filling, a more stable operating distance of 25 micrometers or less to the sapphire window may well have been attainable. While such close spacing has been achieved for up to an hour in an actual example, this may not be long enough for some applications. Reducing the separation to less than 50 micrometers is of particular benefit when LTS SQUIDs are used directly as magnetic field sensors so as to achieve even higher spatial resolution, as has been done with many HTS-SQUID microscopes (see the Wellstood, et al., article). The spatial resolution of the present example of the microscope may be demonstrated best with an image of the remnant magnetization of an actual geological sample.

FIG. 7($a$) shows a remnant magnetization image of the magnetic field for a polished basalt slice scanned at a sample-to-pickup coil separation of about 130 micrometers according to an actual example of the present invention. The image was acquired with a scan rate of 10 points per s and a step size of 50 micrometers. The basalt slice was imaged with a two layer, five turns per layer, 250 micrometers diameter pickup coil. From a line scan through the image, features can be identified that are comparable with the diameter of the pickup coil, as expected from close sample-to-coil spacing. As indicated in FIG. 7($b$), there is shown the live scan of the magnetic field along the line as marked by the arrows in FIG. 7($a$). The magnetic field of the basalt is many orders of magnitude larger than the field sensitivity of the actual example. In addition to basalt, we have imaged various other rock samples including 30 micrometers thick sections form the Martian meteorite ALH84001 with much lower magnetizations. Thermal demagnetization studies using the SQUID of the present example provide strong evidence for a low temperature transfer of rocks from Mars to Earth (see the first Weiss, et al., article). Furthermore, by registration of the magnetization images the magnetization of particular grains can be correlated with the petrography of the meteorite (see the second Weiss, et al., article).

The measured magnetic field noise for a 500 micrometer diameter double layer pickup coil with 20 turns is shown in FIG. 8. FIG. 8 illustrates the magnetic or rms field noise of an LTS scanning SQUID microscope. The pickup coil has an input impedance of 1.8 micro H. The noise spectra were measured in the actual example at the highest sensitivity settings with a low pass filter of 1 kHz. The white noise level corresponds to a magnetic field sensitivity of 330 fT/Hz$^{1/2}$. The l/f noise of the commercial sensors used occurs typically well below 1 Hz. The magnetic field sensitivity can be converted to a magnetic moment sensitivity or a minimum detectable current by calculating the maximum flux collected from a magnetic dipole or a wire when scanned across the pickup coil at a typical source to pickup coil distance of 130 micrometers. For this pickup coil of the actual example, $5.4 \times 10^{-17}$ Am$^2$/Hz$^{1/2}$ and 0.37 nA Hz$^{-1/2}$ at frequencies above 100 Hz (see the second Lee, et al., article) has been attained for the disclosed embodiment of the system, which achieved a field sensitivity that is better by a factor of 8, a current sensitivity better by a factor of 7, and a comparable moment sensitivity by reducing the sensor size to 30 micrometers and the sample-to-sensor spacing to 15 micrometers, using a 3 micrometers thick silicon nitride window (see the third Lee, et al., article), having further improved the moment sensitivity to $2.5 \times 10^{-18}$ Am$^2$ Hz$^{-1/2}$ above frequencies of 5 Hz, which corresponds to a field sensitivity of 20 pTHz$^{-1/2}$ and a minimum detectable current of 7.7 nA/Hz $^{1/2}$ and a minimum detectable current of 7.7 nAHz$^{1/2}$.

Since small pickup loop is not matched to the large input inductance of commercially available LTS dc-SQUID sensors and the hand wound pickup coil has a relatively large height compared to the sample to coil spacing, even better performance may be expected by using custom-design dc- SQUID sensors with thin film pickup coils that are either integral with the SQUID self-inductance or at least are matched to the SQUID (see the Ketchen, et al., article). The custom designed integrated SQUID sensors may also enable the reduction of the sample-to-sensor spacing to distances achieved with HTS integrated sensor designs. The directly coupled single chip design is expected to be five to ten times more sensitive than our discrete design; especially at spatial resolutions below 250 micrometers were the inductance of the pickup coil is further reduced. The performance advantage of LTS-SQUID microscopes may be further increased at low frequencies since HTS SQUIDs generally have the onset of the 1/f noise at higher frequencies. The integrated SQUID chips may be used with the disclosed embodiment of the present cryogenic design without any major modifications.

J) Pickup Coil Positional Adjustment

The cold finger 23 can be positioned close to the sapphire window 61 with a set of parallel flexure bearings such as a bearing 203 coupled to a lever mechanism 213. The lever mechanism is attached to an aluminum body housing the bearings 203 pushing a cooper rod 206 up having a SQUID sensor or pickup coil 207 mounted on a sapphire bobbin. The lever 213 allows for a positional accuracy of a few microns. The coarse position of the window 61 relative to the pickup coil 24 can be adjusted with the micrometer screws and the flexible brass bellows 29. The vertical adjustment screws 67 and 70 enable the tilt and the spacing to be adjusted between the pickup coil 24 and the 25 $\mu$m thick sapphire window 61, whereas the horizontal screws 72 and 74 are required to center the pickup coil 24 within the hole 65 of the backing window 63. Typical operational distances between the coil 24 and the sapphire window 61 are about 50 $\mu$m but can be as low as 25 $\mu$m. The bowing of the thin sapphire window under atmospheric pressure is minimized or at least greatly reduced by using the tapered hole 65 of 1.5 mm diameter in the center of the backing window 63 to <1 $\mu$m according to calculations and experimental observations. See, for example, the forementioned Lee, et al article.

The rod 206 is slidably and axially mounted to the center of two flexure bearings extended to the tip of the nitrogen shield. The center of the circular flexure bearings can be moved relative to the outer ring by deforming a diaphragm with a spiral pattern cut into it. The membrane is made from Beryllium-cooper, which remains flexible at temperatures down to 4.2 K.

The center rod has two springs such as the return spring 202 attached to the aluminum block 210 housing the flexure bearing. The springs act therefore as return springs and provide the resistance against which the center rod is moved. The end of the center rod houses a sapphire ball 212 which is pressed against the lever mechanism which is pivoted such that the rod is pressed against the springs if the lever is actuated. The flexure bearing housing is mounted on an L shape bracket 201 mounted onto the bottom plate of the helium reservoir.

Figure 10:
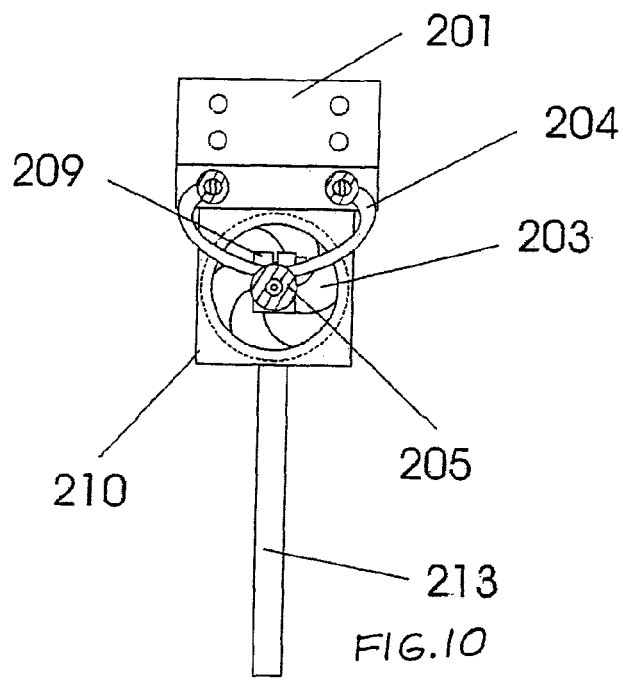
FIG. 10 is a plan diagrammatic view of the lever of FIG. 9.
Figure 9:
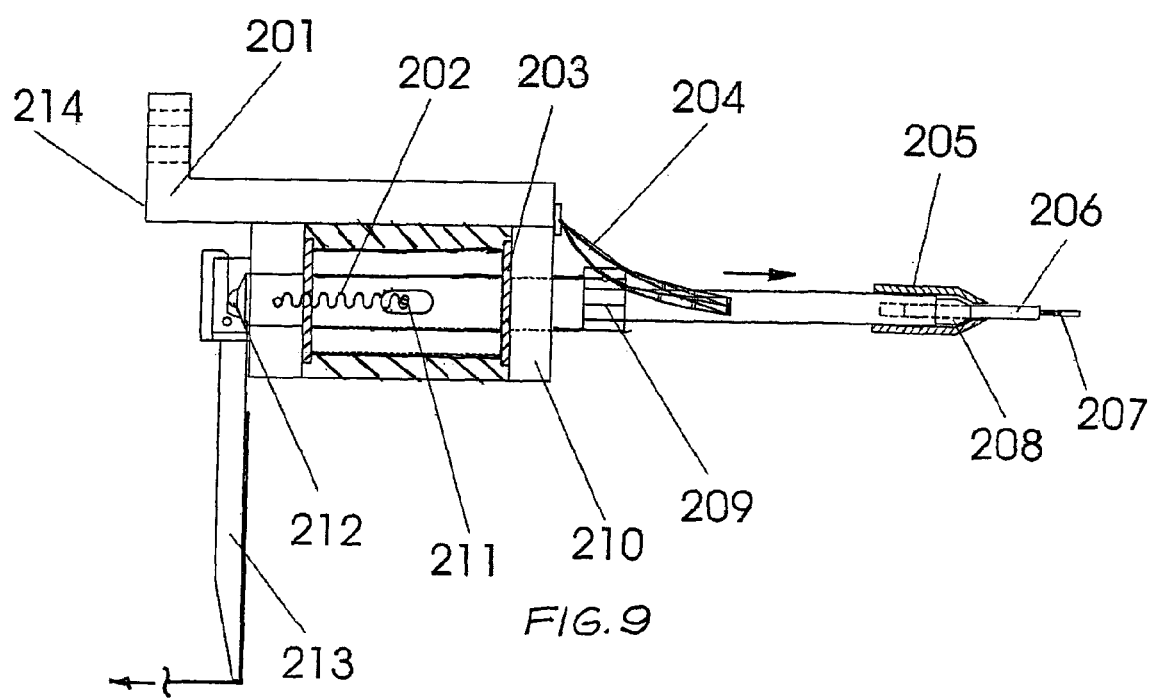
FIG. 9 is a side diagrammatic view of the lever mechanism that allows close spaced adjustment of the sensing element.

In order to anchor the center rod to the helium reservoir flexible cooper braiding 204 is soldered to the center rod and attached by screws to the L shape mounting bracket. At the tip of the center rod miniature collets 205 are used to mount the sapphire rod holding either a pickup coil or a monolithic thin film niobium SQUID sensor. The lever mechanism is coupled with a string to a mechanism mounted on the side of the helium dewar which is used to pivot and actuate the lever mechanism 213. The threaded rod is connected to a rotary vacuum feed through (not shown) at the top of the dewar. If the feed through is turned, the lever is actuated. The mechanism is shown in FIGS. 9 and 10.

According to an actual example of an embodiment of the invention, once the pickup coil is superconducting and exhibits a response to a DC magnetic field, the white flux noise level is 4 $\mu\phi_0 Hz^{-1/2}$, very close to the manufactures specifications, indicating negligible noise contributions from the pickup coil or surrounding metallic structures.

The minimum flux per unit bandwidth detectable at the pickup coil is given by the square root of the spectral density of the equivalent flux noise referred to the pickup loop $$S_\varphi^{(p)} = \frac{2(L_i + L_p)}{L_i \alpha^2} \quad (1)$$

where $L_i$, is the inductance of the input transformer, $L_p$ the inductance of the pickup coil, $\alpha$ the coupling constant and $\epsilon$ the equivalent noise energy of the SQUID. See the forementioned Clarke, et al article. The corresponding minimum detectable magnetic field per unit bandwidth is given by $$B^p = \frac{\sqrt{S_\varphi^{(p)}}}{n\pi\gamma_p^2} \quad (2)$$

where $r_p$ is the radius of the pickup coil and n the number of turns. Eqs. (1) and (2) can be used to calculate and optimize the field sensitivity of our coil geometries. The optimization of a SQUID microscope is in general governed by the nature of the source and the intended measurement. Note that a SQUID microscope, which provides excellent images of distributions of ferromagnetic particles may not necessarily be capable of mapping the magnetic field from distributed, biological current sources for some applications. The minimum detectable magnetic field has a minimum for $L_i=L_p$. The inductance for a 20 turn pickup coil on a 500 $\mu$m diameter bobbin is ≈0.1 $\mu$H, which in the present example is not well matched to the input impedance of $L_i$=1.86 $\mu$H of our SQUIDs, which reduces the maximum obtainable sensitivity. The mismatch becomes worse as the size of the pickup coil and the number of turns is reduced making the approach less practical at resolutions of <250 $\mu$m.

For the present example, the measured magnetic field noise for a 500 $\mu$m diameter double layer pickup coil with 20 turns is shown in FIG. 8. The white noise level corresponds to a magnetic field sensitivity of 330 fT $Hz^{-1/2}$. The 1/f noise of the commercial sensors used occurs typically below 1 Hz.

K) Imaging Action Currents in Cardiac Tissue

Imaging stimulation and action current distributions in cardiac tissue is of particular interest in order to validate and extend a mathematical model called the bidomain model. In the bidomain model (see the first mentioned Roth, et al article, and the Henriquez article), cardiac tissue is represented by a three-dimensional electrical cable with distinct intracellular and extracellular spaces separated by cell membrane. The cell membrane is in general an active non-linear element (see the second mentioned Roth, et al article). In a physiologically realistic implementation, the electrical conductivities in the intracellular and extracellular spaces are different and directionally dependent, which results in non-intuitive current distributions especially during propagation. The bidomain model could be viewed as an intermediate step to link the sub-micron spatial scale associated with molecular electrophysiology to the spatial scale of macroscopic electrical behavior of the intact heart, which could lead to a better understanding of the electrocardiogram (ECG) and the magnetocardiogram (MCG). Hereinafter described is the experimental setup and present initial results obtained on isolated, perfused rabbit hearts.

L) Experimental Method

In an experiment using an embodiment of the present invention, New Zealand white rabbits (4–5 kg) were first preanesthetized with intramuscular ketamine (50 mg/kg). Following similar methods previously published (see Lin, et al article), heparin (2000 units) and pentobarbital (50 mg/kg) were then administered intravenously for anesthesia. The hearts were excised quickly and moved to a Langendorff perfusion system. To perfuse the coronary arteries in a retrograde manner, the ascending aorta was cannulated and secured. The perfusate was a modified HEPES solution containing 108 mM NaCl, 5 mM KCl, 5 mM HEPES, 2.4 mM $CaCl_2$, 1 mM $MgCl_2$, 20 mM $C_2H_3O_2Na$, and 10 mM glucose. The continuously oxygenated solution was kept at 37° C., and pH was adjusted to 7.4±0.05 using NaOH or HCl solution. Coronary perfusion pressure was maintained at 80–95 mmHg. The calcium channel blocker BDM—diacetyl monoxime was added at a concentration of 0.75 g/l to minimize motion artifacts.

After a few minutes the Langendorff perfused heart was transferred to a Plexiglas tissue bath on top of the scanning stage pedestal. The temperature of the bath was kept at 37° C. by continuously circulating the perfusate through an heat exchanger. The heart was fixed with a few sutures in a support frame with the left ventricular free wall accessible to the tail of the SQUID microscope. A 30 μm thick mylar foil was placed across the surface of the heart to stabilize and flatten the surface further, allowing the heart to be scanned while slightly pressed against the sapphire window of the SQUID microscope. A coaxial electrode with a platinum-iridium core electrode was inserted through the posterior wall into the cardiac tissue of the left ventricular wall and terminated just below the surface. The platinum-iridium electrode was 300 μm thick, pointed, insulated up to 300–500 μm below the tip and about 3 mm longer than the outer return electrode. This electrode was positioned perpendicular to the plane defined by the pickup coil and was chosen to minimize the magnetic field generated by the electrode during stimulation.

The electrode in the left ventricular wall was used to override the sinus node, the natural pacemaker of the heart. A cathodal current pulse was used at three times the threshold (typically 1.5 mA) and a frequency of 2–4 Hz to pace the heart continuously. The duration of the stimulation pulse was 5 ms. The stimulation pulse and the read out of the SQUID flux-locked loop electronics were synchronized by the data acquisition computer driving the scanning stage. The bandwidth of the SQUID electronics was set to 1 kHz and the data were five times over sampled. In order to image the magnetic fields generated by stimulus and action currents we recorded the MCGs with the SQUID microscope on the surface of the isolated Langendorff perfused rabbit heart.

For the purpose of the experiment, the MCGs were acquired at 1600 locations on the surface spaced 400 .mu.m apart on a 16.times.16 mm.sup.2 grid with the stimulation electrode in the center of the grid. FIG. 11(b) shows a representative MCG taken at a location of the scanning grid. FIG. 11(a) shows the scanning area on the heart diagrammatically. As shown in FIG. 11(a), the left ventricular free wall was chosen since the cardiac muscle fiber orientation is relatively homogeneous and straight although the fiber rotates by 90.degree. from the epi- to the endocardial surface over a depth of .apprxeq.3 mm.;

Results

The MCGs were combined to produce a time series of two-dimensional magnetic field maps spaced 1 ms in time. The magnetic field map during the cathodal stimulation is shown in FIG. 12. The magnetic field clearly shows a octopolar pattern with the magnetic field pointing out of the page in quadrants I and III and with an opposite direction in quadrants II and IV. The peak field is about 2.3 nT and the fiber direction is along the x-axis of the image. A current pattern is overlaid on the magnetic field data to visualize qualitatively the currents during stimulation. To calculate the currents from the magnetic field maps, we made as a first-order approximation the assumption that the current distribution [10] is two dimensional. It is clear that the magnetic field is generated by four current loops of alternating directions, consistent with this assumption.

Figure 13:
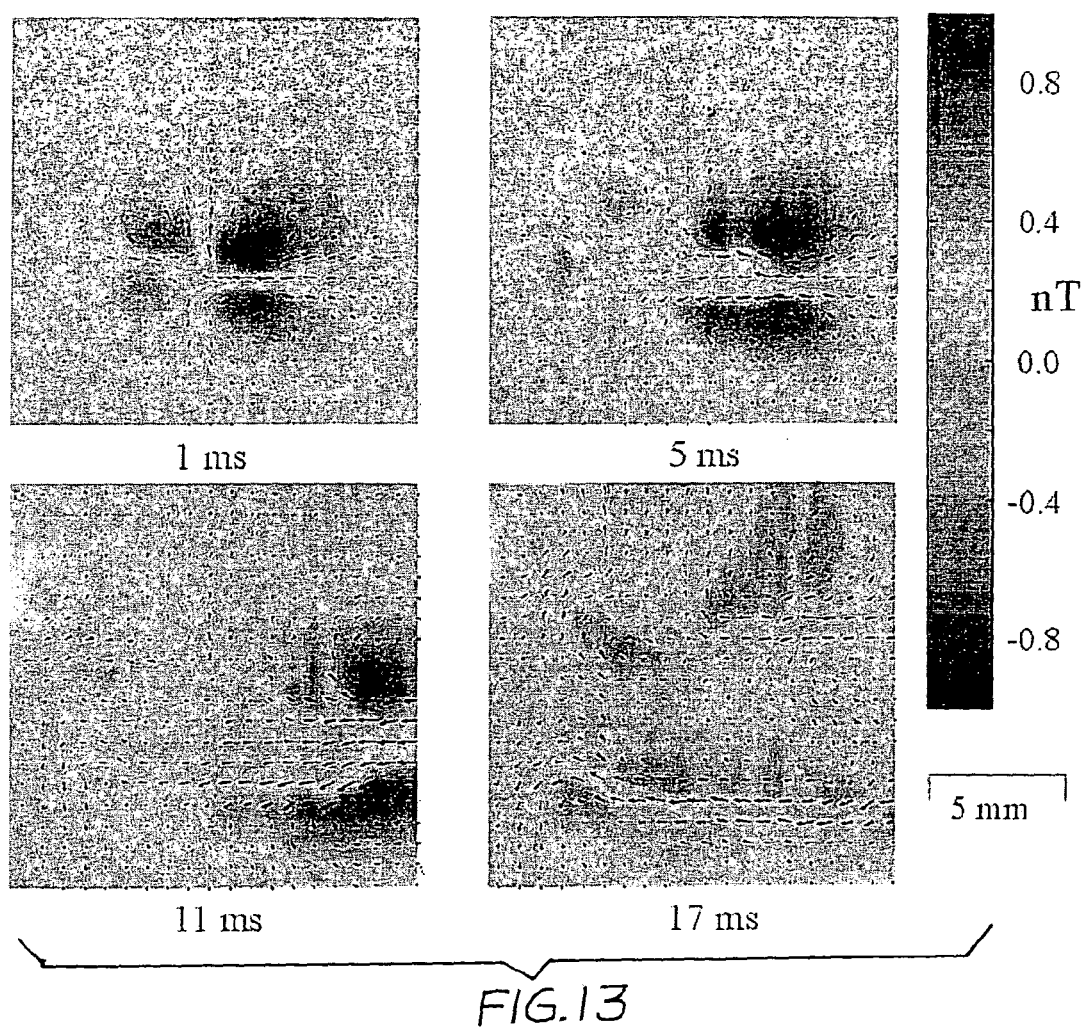

The magnetic field maps at 1, 5, 11 and 17 ms after the stimulation are shown in FIG. 13. The magnetic field maps after the stimulus shows a reversal in currents immediately after current injection and subsequently the generation and propagation of an elliptical action-current wave front pushing the four current loops outward. At times greater than about 8 ms the four loops begin to disappear and a dominant wave front forms in quadrant III and IV.

The formation of the observed octopolar pattern is in qualitative agreement with predicted theoretical calculations assuming a bidomain model and a two-dimensional homogeneous slice of cardiac tissue for injected current and the initial phases of action potential propagation. See the forementioned Sepulveda, et al and the Barach, et al articles. The observation of the four current loops only after the stimulus is a very sensitive test of the bidomain model since the magnetic field is zero unless the intra- and extracellular domains have different anisotropy ratios.

However, the magnitude of the magnetic field and the complex pattern formation after the first few milliseconds are an indication of the three-dimensional nature of cardiac tissue, a dominant role of fiber orientation, and possibly the effect of heterogeneities.

A SSM has been developed according to an embodiment of the invention for imaging biomagnetic field in cardiac tissue using low temperature superconductors for room temperature samples with sub-millimeter resolution. Images are presented of magnetic fields generated by time-dependent stimulus and action currents in cardiac tissue providing a sensitive test that confirms the validity of the bidomain model. For a 500 μm diameter pickup coil a field sensitivity of 330 fT $Hz^{-1/2}$ is achieved for some applications for frequencies of <1 Hz. Since the small pickup loops are not matched to the large input impedance of commercially available low $T_c$ DC-SQUID sensors, even better performance may be achieved for some applications by using custom-designed DC-SQUID sensors with pickup coils that are either integral with the SQUID self-inductance or at least are matched to the SQUID (see the forementioned Ketchen, et al article). This directly coupled, single-chip design may be 5–10 times more sensitive than the discrete design, especially at spatial resolutions below 250 μm, where the inductance of the pickup coil is further reduced. The integrated SQUID chips could be used with the present example of the cryogenic design without any substantial major modifications. The merger of SSMs with 4 K, closed-cycle cryogenic refrigerators enables ultra-high resolution SQUID microscopes with a spatial resolution of 50–300 μm and a field sensitivity on the order of 1 pT Hz$^{-1/2}$ are able to be used by industrial and academic laboratories with little or no prior experience with either cryogenics or SQUID apparatus. These devices may then be applied to other problems, where the sensitivity of existing magnetic imaging techniques is inadequate.

Alternative Detection Coils

Alternatively, in place of the detection coil 24, there are other detection coils that may be employed with the microscope 10.

In general, in connection with the design of the detection coil, since the total flux in a superconducting loop is conserved, any change in external field through the pickup coil will induce a current in the flux transformer which must satisfy $$\Delta\Phi = NA\Delta B = (L_{coil} + L_{SQUID})\Delta I \quad (1)$$

where $\Delta B$ is the change in applied field; N, A, and $L_{coil}$ are the number of turns, area, and inductance of the pickup coil; $L_{SQUID}$ is the input inductance of the SQUID; and $\Delta I$ is the change in current in the superconducting circuit.

To calculate the sensitivity and noise level of a simple detection coil system, the inductance of the detection coil must be known. The inductance of a flat, tightly wound, circular multi-turn loop of superconducting wire is given by [Grover F W. Inductance Calculations, Working Formulas and Tables, New York: Dover, 1962]

$$L = 0.4 N^2 \pi r_{coil}[\log_e(8 r_{coil}/r_{wire}) - 2] \quad (2)$$

where $r_{coil}$ is the radius of the detection coil and $r_{wire}$ is the radius of the (superconducting) wire. Knowing the coil inductance $L_{coil}$ and rewriting eq. 2 as $$\Delta B = (L_{coil} + L_{SQUID})\Delta I / NA \quad (3)$$

for a magnetometer, the maximum sensitivity will occur when the impedance of the detection coil matches that of the SQUID sensor ($L_{coil} = L_{SQUID}$). This can be seen by differentiating $\Delta B \Delta I$ with respect to N. If increased sensitivity is needed, the impedance of the detection coil should be matched to that of the SQUID sensor. Since the SQUID system has an output proportional to the input current, maximum or at least increased sensitivity is obtained by using the input circuit that provides the maximum current into the SQUID and satisfies all other constraints of the experimental apparatus.

Several factors affect the design of the detection coils ["Superconducting instrumentation", Sarwinski R E, Cryogenics, 17: 671–679 (1977)], ["Biomagnetic instrumentation", Romani G-L, Williamson S J, Kaufman L., Rev. Sci. Instrum. 53: 1815–1845 (1982)], ["Multi-SQUID devices and their applications", llmoniemi R, Knuutila J, Ryänen T and Seppä H., In: Brewer D F, ed. Progress in Low Temperature Physics, vol XII. Amsterdam: Elsevier, 1–63 (1989)]. These include the desired sensitivity of the system, the size and location of the magnetic field source and the need to match the inductance of the detection coil to that of the SQUID sensor. Magnetic imaging of small objects normally requires them to be in relatively close proximity to the sensing element. The ability to separate field patterns caused by sources at different locations and strengths requires a good signal-to-noise ratio. At the same time, one has to find the coil configuration that gives the best spatial resolution. Unfortunately, these two tasks are not independent. For example, increasing the pickup-coil diameter improves field sensitivity, but sacrifices spatial resolution. In practice, system design is restricted by several constraints: the impedance and noise of the SQUID sensors, the size of the dewar, the number of channels, along with the distribution and strength of external noise sources. For a simple circular loop magnetometer, a single magnetic dipole can be localized to within about ⅒th to about ¹⁄₂₀th of the loop diameter, provided a sufficient signal-to-noise ratio exists and that the dipole be relatively close to the detection loop (e.g., about three coil diameters). The choice of coil size is dependent on the desired spatial resolution and the needed magnetic field sensitivity. Since magnetic flux sensitivity ($\Phi_n = B_n$ A, where is the minimum detectable change in magnetic field) for a given SQUID sensor is fixed, the product of the square of the spatial resolution ($\delta$) (proportional to the detection coil diameter $r_{coil}$) and the magnetic field resolution is a constant (i.e., $B_n \delta^2 = $const.).

Normally, SQUID magnetometers map the vertical (sometimes referred to as the axial) component of the magnetic field ($B_z$). There are a variety of detection coils that can be used in making magnetic measurements for biomagnetic, geophysical and non-destructive evaluation measurements. The magnetometer (FIG. 12) responds to the changes in the field penetrating the coil. More complicated gradiometer coil configurations (FIGS. 15–19) provide the advantage of discriminating against unwanted background fields from distant sources while retaining sensitivity to nearby sources. Magnetic field sensing systems can also be fabricated with non-vertical ($B_x$ and/or $B_y$) sensing elements (FIG. 21) or gradiometer variants.

While magnetometers have the greatest sensitivities, they are extremely sensitive to the outside environment. This may be acceptable if one is measuring ambient fields. If what is to be measured is close to the detection coil and weak, outside interference may prevent measurements at SQUID sensitivities. If the measurement is of a magnetic source close to the detection coil, a gradiometer coil may be preferred. The field of a magnetic dipole is inversely proportional to the cube of the distance between the dipole and the sensor. It follows that the field from a distant source is relatively uniform in direction and magnitude at the sensor. If two identical and exactly parallel loops wound in opposite senses are connected in series and separated by a distance b (the baseline), we obtain a coil (FIG. 15) is obtained that will reject uniform fields.

Since the response of a single coil to a magnetic dipole goes as $1/r^3$, an object that is much closer to one coil than the other, will couple better to the closer coil than the more distant. Sources that are relatively distant will couple equally into both coils. For objects that are closer than 0.3 b, the gradiometer acts as a pure magnetometer, while rejecting more than 99% of the influence of objects more than 300 b distant. (FIG. 22) shows the response of gradient coils relative to magnetometer response ($1/r^3$ suppressed). In essence, the gradiometer acts as a compensated magnetometer.

Unfortunately background fields are rarely uniform. However, if their sources are sufficiently remote, the gradient in the field over the sensing coils is both small and uniform. In this case, it is possible to use two gradiometers connected in series opposition to further minimize the response of the system to these sources (FIG. 17). This technique greatly reduces the sensitivity to environmental magnetic noise, both uniform fields and linear field gradients. This can increase the signal-to-noise ratio by about a factor of $10^6$ above that achieved with a single loop magnetometer. The 2nd order configuration has enabled the recording of magnetic encephalograms in an unshielded urban environment [Biomagnetism", Williamson S J, Kaufman L. J. *Magn. Mag. Mat.*, 22: 129–202 (1981)]. This technique can obviously be extended to higher orders by connecting in series opposition two 2nd order gradiometers, etc. ["Spatial discrimination in SQUID gradiometers and 3rd order gradiometer performance", Vrba J, Fife A A, Burbank M B, H. Weinberg H, Brickettt P A., *Can. J. Phys.;* 60: 1060–1073 (1982)]. Doing so, however, reduces the sensitivity of the instrument to the signal of interest and may not significantly improve the signal-to-noise ratio. Asymmetric gradiometers (FIGS. 18 and 19) offer higher spatial resolution at the cost of more complex fabrication requirements.

Axial gradiometers, measuring the radial component of the field, have been popular because of the easy intuitive interpretation of the results. Another trend in magnetic instrumentation is the use of planar detection coils [Multi-SQUID devices and their applications:, Ilmoniemi R, Knuutila J, Ryänen T and Seppä H., In: Brewer D F, ed. *Progress in Low Temperature Physics*, vol XII. Amsterdam:Elsevier, 1–63 (1989)]. Planar coils are of interest because the construction would be simpler and interpretation of data is relatively simple. In practice, however, simple magnetometers are not feasible, even inside magnetic shields: mechanical vibrations of the dewar in the remnant magnetic field and nearby noise sources may disturb the measurement. Because of the compact structure and excellent intrinsic balance of planar devices, thin-film gradiometers have definite advantages when designing systems requiring multiple channels. Analysis of the non-axial components of the magnetic field gradient may require additional data reduction techniques, but with the use of sophisticated computer modeling, not insoluble.

A second (or higher) order gradiometer (FIG. 17) detection coil may be employed for the microscope (FIG. 1) in place of the pickup coil 24 and is connected to a separate SQUID sensor. The use of a higher (than 1 st) order gradiometer would be to allow the system to operate without the need for external magnetic shielding. A second order gradiometer is disclosed in ["SQUID Detection of Electronic Circuits", R. L. Fagaly, *IEEE Transactions on Magnetics*, MAG-25, 1216 (1989)]

A high sensitivity magnetometer can be made by overlaying a multi-turn detection coil directly over that of an all thin-film SQUID and inductively coupling the detection coil to the SQUID loop. This has the advantage of offering high sensitivity while retaining a flat profile (allowing the closest spacing between the SQUID/magnetometer and the object being sensed [U.S. Pat. No. 5,786,690 "High resolution three-axis scanning SQUID microscope having planar solenoids", John Robert Kirtley and Mark Benjamin Ketchen. Also "Scanning SQUID Microscopy", J. R. Kirtley, *IEEE Spectrum*, vol. 33, pp.40–48 (1996)].

The first embodiment is the use of a small diameter (1 mm) magnetometer or gradiometer to allow imaging of object features <100 μm in size. An advantage of an axial gradiometer (e.g., FIGS. 15 and 17) is its ability to preferentially reject signals from distant noise sources. A relative disadvantage of multi-turn coils wound on a fixed diameter mandrel is that the coils are sequentially layered above the bottom coils or wound as a solenoid. In either case, the structure becomes three dimensional (non-flat) with the upper turns be located further from the object being detected.

A second embodiment of the detection coil is the use of a fractional turn SQUID (FIG. 32), ["Sensitivity enhancement of superconducting quantum interference devices through the use of fractional-turn loops", J. E. Zimmerman, *J. Appl Phys*, vol 42, pp 4483–4487 (1971)] in place of the combined SQUID sensor and separate detection coils or integrated SQUID sensor/magnetometer. Rather than having a single superconducting SQUID loop (FIG. 33), a fractional turn SQUID connects N loops in parallel (FIG. 34) reducing the total inductance of the SQUID while keeping the effective area constant. This gives rise to higher sensitivity for a fixed diameter. Additionally, its planar fabrication places the sensing element closer to the object being detected that a three dimensionally multi-turn or solenoidally wound magnetometer or gradiometer. Axial (e.g., $dB_z/dz$) or planar (e.g., $dB_z/dx$) gradiometers can be synthesized by appropriately positioning two or more fractional turn SQUIDs and electronically subtracting their outputs.

A third embodiment of the detection coil is the use of an apodized or spiral detection coils [U.S. Pat. No. 5,038,104 "Magnetometer flux pick-up coil with non-uniform interturn spacing optimized for spatial resolution", John Wikswo, Jr., and Bradley J. Roth (1991)] (FIG. 20). The advantage of an apodized coils is greater spatial resolution than a multi-turn coil of the same outer diameter that has been wound on a fixed diameter mandrel (necessitating that the additional turns be wound sequentially above the lowest coil).

Like the fractional turn SQUID, planar fabrication places the sensing element closer to the abject being detected that a three dimensionally multi-turn or solenoidally wound magnetometer or gradiometer. Apodized coils lend themselves to the creation of intrinsic axial gradiometers while retaining their minimum vertical thickness.

A fourth embodiment is the use of a planar gradiometer (FIG. 16). Like the axial gradiometer, it has the advantage of preferentially rejecting distant noise sources. Its planar configuration allows the closest possible spacing to the object(s) being detected. Additionally, planar gradiometer offer easier data interpretation of magnetic fields generated by currents flowing through conductive line elements. This can be illustrated by plotting the magnetic field intensities as a function of lateral position. FIG. 23 shows the response of a magnetometer (or axial gradiometer) to a magnetic dipole (indicated as the arrow) located beneath the magnetometer detection coil and that of the response of a planar gradiometer to a magnetic dipole beneath the planar gradiometer coil (the + and − indicate the sense (direction) of the two coils connected in series). FIG. 24 shows the response of a magnetometer (or axial gradiometer) to a line current element (viewed end on) beneath the magnetometer detection coil and that of the response of a planar gradiometer to a line current element (viewed end on) beneath the planar gradiometer coil.

One can also use a single-loop dc SQUID (FIG. 35) as the detection coil ["Scanning SQUID Microscope with Micron Resolution", J. Anderberg, M. Cloclough, D. B. Crum, D. N. Paulson and R. L. Fagaly, *IEEE Transactions on Applied Superconductivity*, 13, pp. 231–234 (2003)]. In this embodiment, most of the SQUID loop would be shielded by a ground plane, but a small portion would project beyond the shielding and act as the pick-up loop (single or multiple turns). Alternatively, a bare SQUID loop (FIG. 36) [U.S. Pat. No. 5,491,411] could be used.

Each of these alternative embodiments, illustrated in FIGS. 12–21, 35 and 35, can be implemented as a single detection coil or an array of multiple detection coils to replace the pickup coil 24.

Magnetic Susceptibility

Properties of matter can change due to the presence of energizing fields and currents. Each of these described configurations can be enhanced by placing a magnetizing coil such that a magnetic field is placed on the object being measured.

Without the presence of an external magnetizing field, by scanning the sample beneath the sensing element(s), it is possible to image a) intrinsic or applied currents in a circuit or superconductor, (FIG. 25), remnant magnetization, (FIG. 26), flaw-induced perturbations in applied currents, (FIG. 27), Johnson noise or corrosion activity in conductors, (FIG. 28). By placing a constant and/or time varying magnetic field on the object being scanned, it is possible to image ac susceptibility or eddy currents and their perturbations by flaws, (FIG. 29), hysteretic magnetization in ferromagnetic materials in the presence of an applied stress and/or an applied field (FIG. 30), and diamagnetic and paramagnetic materials in an applied field, (FIG. 31).

While only a simple magnetometer is illustrated, the methods are valid for all types of detection coil configurations. Also, while the examples in FIGS. 29–31 have the magnetic field in a vertical ($B_z$) orientation, horizontal ($B_x$ and/or $B_y$) magnetic fields can also be applied.

N) Detection Coil Modularity

The detection coils for the microscope 10 are interchangeable for modularity purposes.

The sapphire bobbin 49 is inserted into a collet (not shown) at the end of the cold finger 23 (FIG. 1).

The monolithic thin film SQUID sensors are generally fabricated on silicon wafers. In order to mount the sensors on the silicon wafers we grind the silicon chips round. The chip is attached to the a sapphire rod with a low temperature adhesive (Stycast). The sapphire rod has a conical ground tip. Once the chip is mounted on the tip the chip is further ground on the tip in order to reduce the diameter even further and the prevent and edge at the backside of the chip. The next step is to mask the SQUID and to evaporate silver or gold over the edge providing electrical contact from pads on the side of the sapphire rod to the contact pads on the top. Using thin films of metal has the advantage that the thickness of the metal does not increase the standoff. Alternatively, the contact to the side can also be achieved with silver epoxy, Wires are brought up the sides of the tip and connected to the pads on the side as high up as possible. The wires are then connected to the input circuitry of the electronics operating the SQUID sensor. The mounting of the SQUID chip on the sapphire rod is illustrated in FIG. 2. Once the SQUID sensor is mounted on the sapphire rod it is then inserted into the collet on top of the cold finger described in this section.

This modular approach allows customization of the SQUID microscope for different applications ranging from geomagnetism to biomagnetism. The user of the SQUID microscope would just insert a sapphire rod with a different sensor configuration depending on the application requirements of the experimental situation. It has to be realized that different sensor configurations are needed in order to have the best combination of spatial resolution and field sensitivity available. This modular approach is necessary for many applications where the field originate from distributed sources such as action currents in brain and cardiac tissue.

While particular embodiments of the present invention have been disclosed, it is to be understood that various different modifications and combinations are possible and are contemplated within the true spirit and scope of the disclosed embodiments. There is no intention, therefore, of limitations to the exact abstract and disclosure herein presented.

What is claimed is:

1. An apparatus for high resolution imaging of a sample, comprising:
   a SQUID evacuated dewar;
   a SQUID sensor cooperating with the dewar to sense magnetic flux from the sample being imaged, the sensor having a detection coil;
   a cold finger;
   the dewar having a thin window;
   means for mounting the sensor remotely from the coil;
   the detection coil being electrically connected to the SQUID sensor;
   a mechanism for mounting the detection coil at the distal end of the cold finger in close proximity to the thin window, the mechanism including a bobbin having a tip;
   a material disposed on the bobbin tip for cooling the detection coil below the transition temperature
   a radiation shield mounted within the dewar and having an extension surrounding the detection coil to help maintain its cold temperature; and
   wherein the extension prevents or reduces circular currents in the plane of the detection coil.

2. An apparatus according to claim 1, further including a thick backing window overlying the thin window on the vacuum side thereof.

3. An apparatus according to claim 2, wherein said thick backing window includes a hole therein for receiving the detection coil and the distal end of the shield extension.

4. An apparatus according to claim 3, wherein the shield extension is conical and the window hole is tapered.

5. An apparatus according to claim 2, wherein the thick backing window is composed of sapphire material.

6. An apparatus according to claim 1, wherein the thin window is composed of sapphire material.

7. An apparatus according to claim 1, further including a positioning mechanism for moving the detection coil adjustably toward and away from the thin window along a substantially straight path of travel.

8. An apparatus according to claim 7, wherein the positioning mechanism includes a lever.

9. An apparatus according to claim 8, wherein said positioning mechanism includes a flexure bearing.

10. An apparatus according to claim 1, wherein said detection coil is a bare SQUID magnetometer.

11. An apparatus according to claim 10, wherein said detection coil is an all-thin film SQUID magnetometer.

12. An apparatus according to claim 1, wherein said detection coil is a magnetometer coil connected to a SQUID sensor.

13. An apparatus according to claim 1, wherein said detection coil is a first derivative gradiometer.

14. An apparatus according to claim 1, wherein said detection coil is an asymmetric gradiometer.

15. An apparatus according to claim 1, wherein said detection coil is an apodized magnetometer coilgradiometer.

16. An apparatus according to claim 1, wherein said detection coil is a vector magnetometer.

17. An apparatus according to claim 1, wherein said detection coil is a gradiometer.

18. An apparatus according to claim 1, wherein said detection coil is a fractional turn SQUID magnetometer.

19. An apparatus according to claim 1, wherein the extension includes at least one longitudinally extending slot.

20. An apparatus according to claim 19, wherein
the extension being generally conical in shape; and
the upper portion of the extension being larger than the lower portion of the extension.

21. An apparatus according to claim 1, wherein the extension is composed of aluminum.

22. An apparatus according to claim 1, wherein the extension is composed of coil foil.

23. An apparatus according to claim 1, wherein the extension is composed of G-10 fiber composite for reducing circular currents in the plane of the detection coil.

24. An apparatus according to claim 1, further including a cold finger reservoir and a radiation shield reservoir.

25. An apparatus according to claim 24, wherein the cold finger reservoir contains liquid helium.

26. An apparatus according to claim 24, wherein the radiation shield reservoir contains liquid nitrogen.

27. An apparatus according to claim 24, wherein the radiation shield surrounds the cold finger reservoir and the radiation shield reservoir.

28. An apparatus according to claim 24, wherein the radiation shield reservoir is disposed above the cold finger reservoir.

29. An apparatus according to claim 1, wherein the material is aluminum Mylar.

30. A method of high resolution imaging of a sample, comprising:
sensing magnetic flux from the sample using a SQUID evacuated dewar and a SQUID sensor having a detection coil;
mounting the SQUID sensor within the dewar remotely of the detection coil;
mounting the detection coil on a bobbin having a tip at the distal end of a cold finger in close proximity to a thin window forming a part of the dewar;
placing a material on the bobbin tip for cooling the detection coil below the transition temperature;
mounting a radiation shield having an extension within the dewar and surrounding the detection coil; and
using the extension to prevent or reduce circular currents in the plane of the detection coil via the extension.

31. A method according to claim 30, wherein the material is aluminum Mylar.

32. A method according to claim 30, further including replacing the detection coil with another detection coil.

33. A method according to claim 30, further including applying a magnetic field to the sample being imaged prior to or during said sensing.

* * * * *